(12) United States Patent
Nomura

(10) Patent No.: US 8,125,261 B2
(45) Date of Patent: Feb. 28, 2012

(54) MULTI-POWER SOURCE SEMICONDUCTOR DEVICE

(75) Inventor: Masahiro Nomura, Minato-ku (JP)

(73) Assignee: NEC Corporation, Tokyo (JP)

( * ) Notice: Subject to any disclaimer, the term of this patent is extended or adjusted under 35 U.S.C. 154(b) by 202 days.

(21) Appl. No.: 10/565,190

(22) PCT Filed: Jul. 15, 2004

(86) PCT No.: PCT/JP2004/010096
§ 371 (c)(1), (2), (4) Date: Jan. 20, 2006

(87) PCT Pub. No.: WO2005/008777
PCT Pub. Date: Jan. 27, 2005

(65) Prior Publication Data
US 2006/0232316 A1  Oct. 19, 2006

(30) Foreign Application Priority Data
Jul. 22, 2003  (JP) .................................. 2003-277563

(51) Int. Cl.
*H03K 3/00* (2006.01)

(52) U.S. Cl. ........................................ 327/270; 327/296
(58) Field of Classification Search .................. None
See application file for complete search history.

(56) References Cited

U.S. PATENT DOCUMENTS

| | | | |
|---|---|---|---|
| 5,926,046 A * | 7/1999 | Uchida | 327/158 |
| 6,081,145 A | 6/2000 | Bandai et al. | |
| 6,262,616 B1 * | 7/2001 | Srinivasan et al. | 327/264 |
| 6,369,627 B1 * | 4/2002 | Tomita | 327/158 |

(Continued)

FOREIGN PATENT DOCUMENTS

CN  1404147 A  3/2003

(Continued)

*Primary Examiner* — Lincoln Donovan
*Assistant Examiner* — Sibin Chen
(74) *Attorney, Agent, or Firm* — Sughrue Mion, PLLC

(57) ABSTRACT

In a multi-supply-voltage semiconductor device including multiple blocks each of which has independent clock circuit, and operating with variable power supply, variable delay circuit which changes the amount of delay in accordance with the voltage value of the variable power supply is provided to a clock signal supplied to several blocks from clock generator circuit. This can reduce clock skew between the blocks even when the power supply voltage of variable power supply is changed.

1 Claim, 22 Drawing Sheets

U.S. PATENT DOCUMENTS

| | | | |
|---|---|---|---|
| 6,393,577 B1 | 5/2002 | Akamatsu et al. | |
| 6,762,957 B2 * | 7/2004 | Hsu et al. | 365/189.05 |
| 6,924,679 B2 * | 8/2005 | Seno et al. | 327/158 |
| 7,181,638 B2 * | 2/2007 | Welker et al. | 713/600 |
| 7,403,053 B2 * | 7/2008 | Casper et al. | 327/149 |
| 2002/0190283 A1 * | 12/2002 | Seno et al. | 257/275 |
| 2008/0278125 A1 * | 11/2008 | Pigott | 323/271 |
| 2008/0303600 A1 * | 12/2008 | Masleid | 331/57 |
| 2009/0140773 A1 * | 6/2009 | Cheung | 327/3 |

FOREIGN PATENT DOCUMENTS

| | | | |
|---|---|---|---|
| JP | 60030262 A * | 2/1985 | |
| JP | 1-2686612 A | 11/1989 | |
| JP | 7-287699 A | 10/1995 | |
| JP | 9-148914 A | 6/1997 | |
| JP | 9-200026 A | 7/1997 | |
| JP | 11-39868 A | 2/1999 | |
| JP | 11-41090 A | 2/1999 | |
| JP | 11-65699 A | 3/1999 | |
| JP | 11-85310 A | 3/1999 | |
| JP | 11-97949 A | 4/1999 | |
| JP | 2000-347764 A | 12/2000 | |
| JP | 2003-78405 A | 3/2003 | |
| WO | 97/24806 A1 | 7/1997 | |

* cited by examiner

RELATED ART

MULTI-POWER SOURCE SEMICONDUCTOR DEVICE

This application claims priority from PCT Application No. PCT/JP2004/010096 filed Jul. 15, 2004 and from Japanese Application No. 2003-277563 filed Jul. 22, 2003, which applications are incorporated herein by reference.

TECHNICAL FIELD

The present invention relates to a multi-supply-voltage semiconductor device operation with multiple power supply voltages and, in particular, to a multi-supply-voltage semiconductor device consisting of multiple blocks, some or all of which have independent clock circuits.

BACKGROUND ART

Electronic equipment such as mobile phones containing semiconductor devices has been reduced in size and power consumption in recent years. Accordingly, there is a demand for reduction in power consumption in semiconductor devices.

It is effective for reducing power consumption to decrease power supply voltages. Decreasing power supply voltages also decreases leakage current, which results in reduction in power consumption. However, decreasing power supply voltages uniformly also decreases available clock frequencies and hence the operating speed. Therefore, multi-supply-voltage semiconductor devices operating at multiple voltages are used in which the power supply voltage supplied to blocks can be independently changed in such a manner that blocks that do not require a fast operating speed from among the blocks constituting the semiconductor device are supplied with a low power supply voltage and blocks that require a fast operating speed are supplied with a high power supply voltage.

In a stand-by state, leakage current can be minimized and consequently the power consumption can be reduced by supplying a power supply voltage only to blocks that need to be supplied with the power supply voltage.

The term multi-supply-voltage semiconductor device as used in the following description refers to semiconductor devices that operate on multiple power supplies having different voltage values supplied from multiple power supply systems as well as semiconductor devices that operate on multiple power supplies having the same voltage value supplied from multiple power supply systems and semiconductor devices that operate on a single power supply system whose power supply voltage changes.

In conventional semiconductor devices consisting of multiple blocks, some or all of the blocks have independent clock circuits, each of which drives a clock signal used within each block in accordance with a clock signal provided from a common clock generator circuit provided for the multiple blocks. However, when a clock signal is driven within each block, clock skew can occur within each block due to timing disagreement in driving the clock signals in the blocks. Such clock skew between blocks can cause a problem of disagreement in signaling timing between blocks. Therefore, semiconductor devices consisting of multiple blocks use a delay circuit to adjust the timing of a common clock signal inputted into the blocks to control clock skew between the blocks.

FIG. 1 shows a configuration of a conventional multi-supply-voltage semiconductor device that uses such a delay circuit to inhibit clock skew between blocks. The conventional multi-supply-voltage semiconductor device includes two blocks 31, 32, clock (CLK) generator circuit 10, and delay circuit 120. For simplicity, the multi-supply-voltage semiconductor device consisting of two blocks 31, 32 will be described herein. However, semiconductor devices in practice may consist of more than two blocks.

Clock generating circuit 10 generates a clock signal and supplies it to blocks 31 and 32. The clock signal supplied from clock generator circuit 10 to block 32 is delayed by delay circuit 120 inserted between them, and a clock delayed by a certain amount of time from the clock signal generated by clock generator circuit 10 is provided to block 32 as its clock signal.

Block 31 includes clock circuit 41 and flip-flop (F/F) circuits 51, 52. Block 32 includes clock circuit 42 and flip-flop circuits 62, 63.

Clock circuit 41 of block 31 drives clock signal CLK1 to be supplied to the circuits within block 31 based on a clock signal from clock generator circuit 10. Clock circuit 42 of block 32 drives clock signal CLK2 to be provided to the circuits within block 32 based on a clock signal delayed by a given amount of time by delay circuit 120.

In such a multi-supply-voltage semiconductor device, proper operation must be guaranteed at all operating points even though the device uses a variable power supply which supplies a power supply voltage changing within a certain range as a power supply. That is, the block circuits (clock circuits and arithmetic circuits) must be designed in such a manner that a clock skew is smaller than a signal propagation delay at all power supply voltages, conversely, a signal propagation delay is larger than a clock skew.

Clock skew between blocks 31 and 32 can be suppressed by using delay circuit 120 that provides a certain amount of delay, unless the amount of delays of clock circuits 41, 42 between blocks 31 and 32 changes depending on the voltage value of variable power supply 101.

For example, in the conventional multi-supply-voltage semiconductor device shown in FIG. 1, the clock skew between blocks 31 and 32 can be suppressed by setting the amount of delay of delay circuit 120 such that clock signal CLK1 outputted from clock circuit 41 is in phase with clock signal CLK2 outputted from clock circuit 42.

However, if the amounts of delay of clock circuits 41, 42 of blocks 31, 32 do not agree with each other in power supply voltage dependency, a problem arises that a change in the power supply voltage of variable power supply 101 changes each clock circuit delay, increasing the clock skew between the blocks significantly.

This problem is more considerable especially if a technique called multi-Vt is used in which MOS transistors with different thresholds (Vt) are formed on the same semiconductor device or if a technique called multi-Tox is used in which MOS transistors having different gate oxide thicknesses (Tox) are formed on the same semiconductor device, because the amounts of delay of clock circuits 41, 42 of blocks 31, 32 differ considerably in power supply voltage dependency from each other.

For example, suppose that the power supply voltage dependencies of the amounts of delays of clock circuits 41, 42 shown in FIG. 1 have characteristics as shown in FIG. 2. Even if delay circuit 120 is set so as to prevent clock skew between the blocks at voltage A of variable power supply 101, a delay difference will be produced and therefore clock skew between the blocks will increase when the power supply voltage of variable power supply 101 is changed to voltage B.

The timing chart in FIG. 3 shows the operation of clock circuits 41, 42 in such a conventional multi-supply-voltage semiconductor device. Referring to the timing chart in FIG. 3, it can be seen that the clock skew which is minimal at voltage A of variable power supply 101 becomes substantial after the supply voltage of variable power supply 101 is changed to voltage B.

Further, as mentioned earlier, some multi-supply-voltage semiconductor devices use both of a non-variable power supply and a variable power supply. FIG. 4 shows a multi-supply-voltage semiconductor device including a block into which a non-variable power supply is inputted and a block into which a variable power supply is inputted. In FIG. 4, non-variable power supply 102 is inputted into block 41 and variable power supply 101 is inputted into block 42. If a different power supply voltage is inputted, a signal with a different level is outputted. In order to accommodate the voltage difference, level shifters 71-73 are provided for signals between blocks 31 and 32. In a multi-supply-voltage semiconductor device as shown in FIG. 4, the power supply voltage of clock circuit 42 in block 32 changes as the supply voltage of variable power supply 101 changes, as shown in FIG. 5. Consequently, clock skew between block 32 and block 31 supplied with different power supplies increases significantly.

A variety of methods have been proposed for reducing clock skew. Japanese Patent Laid-Open No. 11-39868 discloses, for example, a method for reducing clock skew in a semiconductor integrated circuit system consisting of multiple IC chips. In the semiconductor integrated circuit system, one IC chip is classified as a master chip and the others as slave chips. The master chip detects a change in conditions such as a power supply voltage change and indicates the detected change to each of the slave chips. Each slave chip then adjusts the phase of its clock according to the indicated information about the detected change.

Since the conventional semiconductor integrated circuit system consists of multiple IC chips, it has a configuration different from that of a multi-supply-voltage semiconductor device in which multiple blocks are formed on a single chip. If the method described above is to be applied to a multi-supply-voltage semiconductor device, a circuit for detecting a change in the power supply voltage and wiring from the circuit to each block are required. In particular, because a multi-supply-voltage semiconductor device has multiple power supply systems, the device requires a circuit for detecting a change in the power supply voltage of each of those power supply systems. Therefore, the number of circuit conductors increases with the number of blocks that are included and power supply voltage systems that are used, which makes it impractical to use this method for high-density semiconductor devices.

The conventional multi-supply-voltage semiconductor devices as described above use a delay circuit to control the amount of delay to reduce clock skew at a particular power supply voltage and therefore have the problem that clock skew between blocks increases as the power supply voltage changes if the amounts of delay of each clock circuit provided in each block have a different power supply voltage dependency.

DISCLOSURE OF THE INVENTION

An object of the present invention is to provide a multi-supply-voltage semiconductor device capable of reducing clock skew between blocks without using a complex configuration, even if a power supply voltage changes in a case where the delay in each clock circuit provided for each block has a different power-supply-voltage dependency.

In order to achieve the object, a multiple-supply-voltage semiconductor device according to the present invention includes a plurality of blocks, any or all of which have an independent clock circuit, and operating with a plurality of power supply voltages, characterized in that:

a variable delay circuit which provides an amount of delay changing in accordance with a power supply voltage is provided for any or all of the clock signals each of which is provided from a clock generator circuit to each of the plurality of blocks.

According to the present invention, the occurrence of clock skew between blocks due to a change in the power supply voltage can be suppressed by compensating for change in the amount of delay, associated with the change in the power supply voltage, by the variable delay circuit provided between the clock generator circuit and each block.

The variable delay circuit may increase the amount of delay as the power supply voltage decreases.

By increasing the amount of delay of a clock signal supplied to a block when the amount of delay of the clock circuit in the block becomes smaller than that of the clock circuit in another block in which the power supply voltage decreases, an increase in clock skew due to the decrease in the power supply voltage can be suppressed.

Another multi-supply-voltage semiconductor device according to the present invention includes a plurality of blocks, any or all of which have an independent clock circuit, and operating with a plurality of power supply voltages, characterized in that:

a voltage level detector circuit which detects the voltage level of the power supply voltage and outputs the detected voltage level as a voltage level detect signal is provided; and a variable delay circuit which changes an amount of delay in accordance with the voltage level detect signal is provided for any or all of the clock signals each of which is provided from a clock generator circuit to each of the plurality of blocks.

According to the present invention, the voltage level of the power supply voltage is detected by the voltage level detector circuit and the amount of delay of the variable delay circuit is changed in accordance with the detected voltage level.

Yet another multi-supply-voltage semiconductor device of the present invention includes a plurality of blocks, any or all of which have an independent clock circuit, and operating with a plurality of power supply voltages, characterized in that:

a phase synchronizing circuit for bringing the clock signals in the blocks into phase is provided for any or all of clock signals each of which is provided from a clock generator circuit to each of the plurality of blocks.

According to the present invention, clock signals in the blocks do not go out of phase even when the amounts of delay of the clock circuits in the blocks changes due to a change in the power supply voltage, because the phase synchronizing circuit keeps the clock signals in the blocks in phase.

A variable delay circuit which provides an amount of delay changing in accordance with the power supply voltage to compensate for a change in delay of a level shifter may be provided for any or all of the phase synchronizing circuits, the level shifter adjusting a signal level between blocks supplied with different power supply voltages.

According to the present invention, delay changes of level shifters are compensated for in order to suppress an increase in clock skew due to changes in the power supply voltage in case such changes may cause a problem.

Another multi-supply-voltage semiconductor device of the present invention may further include a voltage change detector circuit which detects a change in the power supply voltage; and blocking means for blocking a clock signal generated by the clock generator circuit from being supplied to each of the block circuits during the period in which the voltage change detector circuit determines that the voltage has changed.

According to the present invention, malfunctions can be prevented in order to ensure stable operation of the blocks while the voltage is changing, by preventing a clock signal from the clock generator circuit from being supplied to each block while the power supply voltage is changing.

The multi-supply-voltage semiconductor device may further include a minimum voltage detector circuit which generates and outputs a power supply control signal which provides control to minimize the power supply voltage within a range in which a normal operation can be performed at a predetermined clock frequency; and a power supply control circuit which controls the power supply voltage in accordance with the power supply control signal.

According to the present invention, power consumption can be minimized to achieve a high power efficiency because the power supply voltage can be reduced within a range in which normal operation is ensured.

Another multi-supply-voltage semiconductor device of the present invention includes a plurality of blocks, any or all of which have an independent clock circuit, and operating with a plurality of power supply voltages, characterized in that:

a power supply control circuit which controls the power supply voltage in accordance with an operation mode signal indicating the current operation mode is provided; and a variable delay circuit which changes an amount of delay in accordance with the operation mode signal is provided for any or all of the clock signals each of which is provided from a clock generator circuit to each of the plurality of blocks.

The multi-supply-voltage semiconductor device may further include:

a mode change detector circuit which, when detecting a change of the operation mode indicated by the operation mode signal, forces and keeps a clock control signal at a predetermined value for a given period of time set by a timer contained in the mode change detector circuit; and blocking means for blocking a clock signal generated by the clock signal generator circuit from being supplied to each of the block circuits while the clock control signal is kept at the predetermined value.

BEST MODE FOR CARRYING OUT THE INVENTION

In order to clarify the objects, features, and advantages of the present invention, embodiments of the present invention will be described below in detail with reference to the accompanying drawings.

First Embodiment

Figure 1:
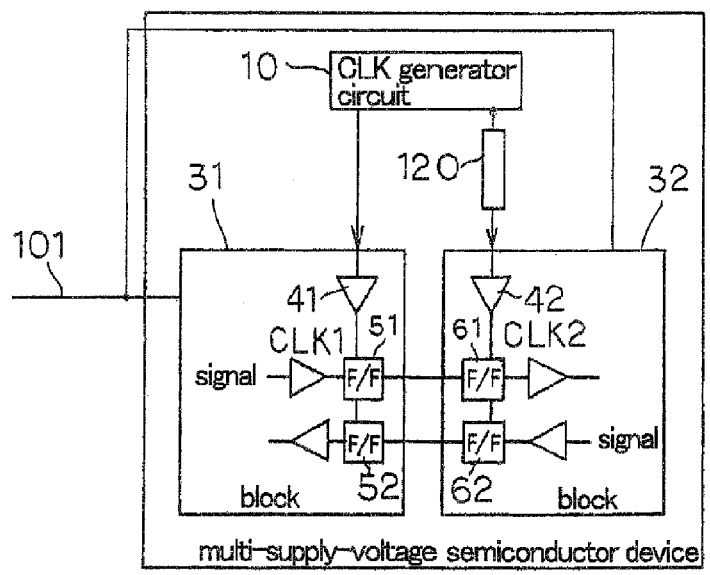
FIG. 1 is a block diagram showing a configuration of a conventional multi-supply-voltage semiconductor device.
Figure 6:
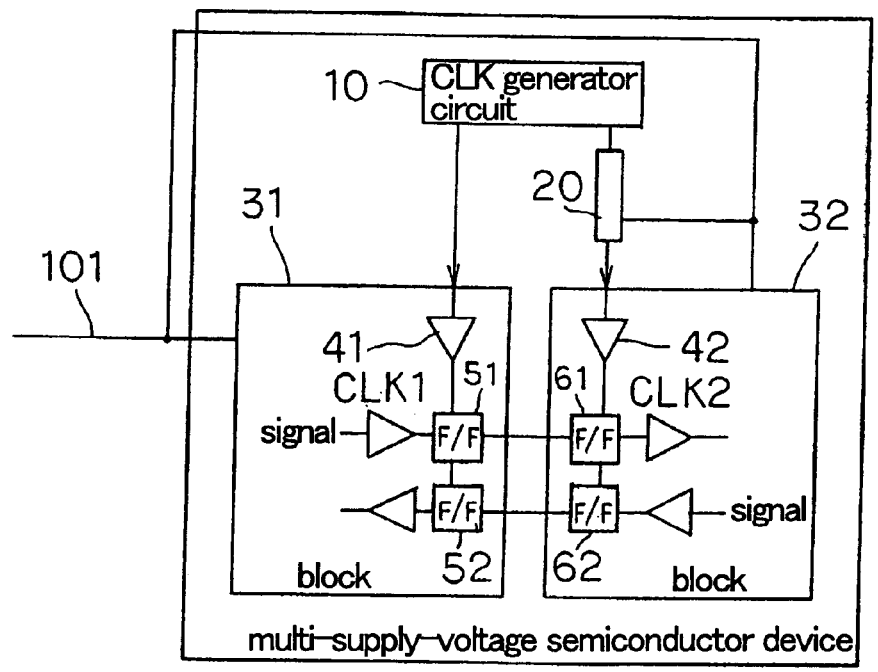
FIG. 6 is a block diagram showing a configuration of a multi-supply-voltage semiconductor device according to a first embodiment of the present invention.

FIG. 6 is a block diagram showing a configuration of a multi-supply-voltage semiconductor device according to a first embodiment of the present invention. Components in FIG. 6 that are the same as those in FIG. 1 are labeled the same reference numerals, the description of which will be omitted.

A multi-supply-voltage semiconductor device according to the first embodiment includes clock (CLK) generator circuit 10, blocks 31, 32, and variable delay circuit 20. The multi-supply-voltage semiconductor device of the first embodiment has a configuration in which delay circuit 120 of the multi-supply-voltage semiconductor device shown in FIG. 1 is replaced with variable delay circuit 20.

Inputted into the multi-supply-voltage semiconductor device of the first embodiment is variable power supply 101 the power supply voltage of which changes. Variable power supply 101 is supplied to variable delay circuit 20 as well as to blocks 31, 32. If variable power supply 101 is the only power supply provided to the multi-supply-voltage semiconductor device, clock generator circuit 10 will be supplied with variable power supply 101. A clock signal is generated from clock generator circuit (such as a driver or PLL) 10. The clock output is provided to block 31 and block 32. Clock circuits 41, 42 are provided in blocks 31, 32, respectively. A signal connection is provided between block 31 and block 32.

Variable delay circuit 20 is a delay circuit that provides an amount of delay changing in accordance with a power supply voltage. Since variable power supply 101 is provided as the power supply voltage in the first embodiment, the amount of delay changes with the voltage value of variable power supply 101.

While for simplicity the present embodiment will be described with respect to the multi-supply-voltage semiconductor device consisting of two blocks 31, 32, the device in practice may consist of more than two blocks.

It is assumed in the following description that block 31 is made up of high-threshold transistors and block 32 is made up of low-threshold transistors. Accordingly, a drop in the voltage of variable power supply 101 substantially increases the amount of delay of clock circuit 41 but increases insignificantly the amount of delay of clock circuit 42.

Variable delay circuit 20 is configured in such a manner that a decrease in the voltage of variable power supply 101 increases the amount of delay. Therefore, when the voltage of variable power supply 101 drops and accordingly the amount of delay of clock circuit 41 becomes greater than the amount of delay of clock circuit 42, the phase of clock signals CLK1, CLK2 is adjusted by the increase in the amount of delay of variable delay circuit 20. Consequently, clock signals CLK1 and CLK2 inputted into Flip-flops 51, 52, 61, and 62 of blocks 31, 32 are brought into phase. Then, blocks 31, 32 operate in accordance with phase-adjusted clocks CLK1, CLK2 and therefore signals are sent and received without delay. The precision of delay of variable delay circuit 20 that can ensure the hold margins of signal connections is adequate. The term "hold margin" refers to the margin that a signal must hold in order to prevent a malfunction after a change of a clock signal.

Figure 7:
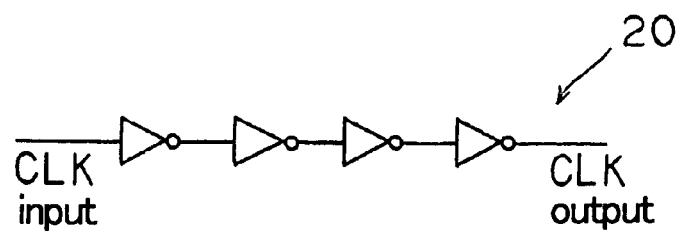
FIG. 7 shows a specific exemplary configuration of variable delay circuit 20 shown in FIG. 6.

FIG. 7 shows a specific exemplary configuration of variable delay circuit 20 shown in FIG. 6. Referring to FIG. 7, variable delay circuit 20 in FIG. 6 is implemented by a multistage inverter in which multiple inverters formed by high-threshold transistors are interconnected in series. The amount of delay in inverters formed by a high-threshold transistor significantly increases as the power supply voltage decreases, compared with normal circuits. Therefore, a variable delay circuit that changes delay in accordance with the power supply voltage can be implemented by the configuration described above.

Figure 8:
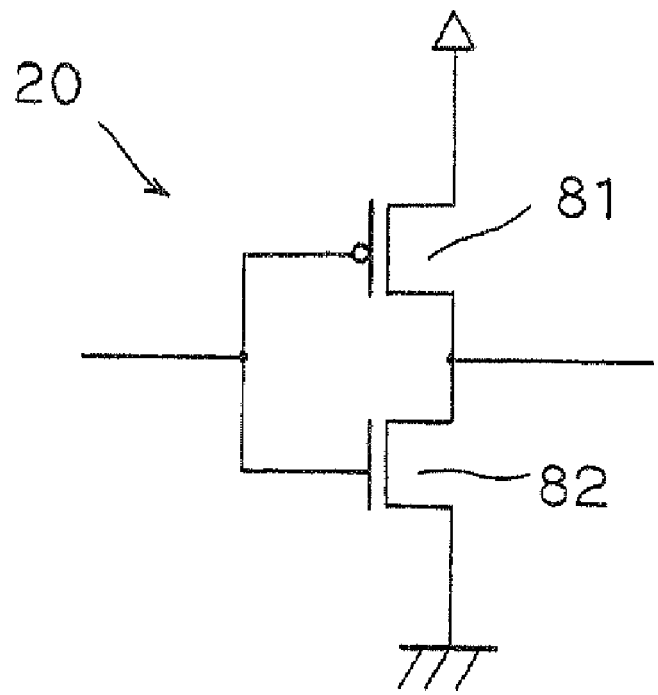
FIG. 8 is a circuit diagram showing an example of an inverter constituting variable delay circuit 20.

Alternatively, each inverter constituting variable delay circuit 20 may be a typical inverter as shown in FIG. 8. The inverter is a typical inverter in which P-channel MOS transistor 81 and N-channel MOS transistor 82 are connected between a power supply voltage and a ground voltage. This configuration is well known to those skilled in the art and therefore description of its operation will be omitted.

Each inverter constituting variable delay circuit 20 may be an inverter formed by a transistor with a long gate length. A transistor with a longer gate length has a larger threshold and accordingly the amount of delay of the transistor significantly increases as the power supply voltage decreases, as compared with normal circuits. Therefore, a variable delay circuit that changes delay in accordance with the power supply voltage as described above can be implemented.

Figure 9:
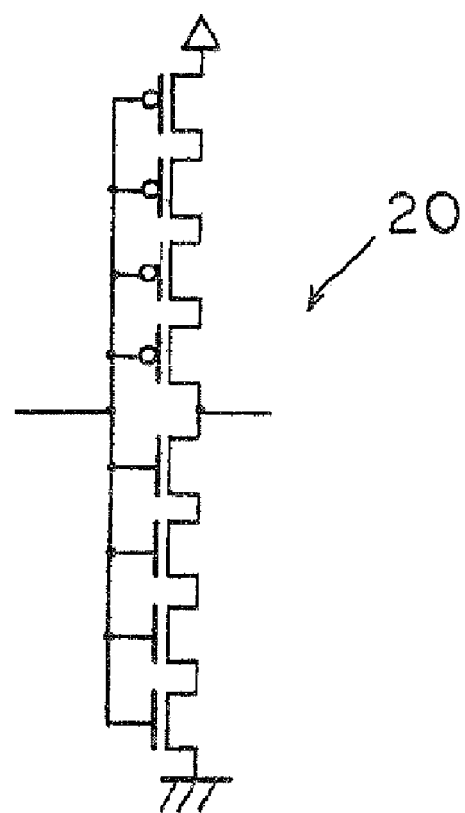
FIG. 9 is a circuit diagram showing another example of an inverter constituting variable delay circuit 20.

Alternatively, each inverter constituting variable delay circuit 20 may be an inverter as shown in FIG. 9. The inverter shown in FIG. 9 is a multistage inverter consisting of a large number of stages stacked vertically. By vertically stacking transistors, a substrate effect can be provided, which increases the threshold of the transistors and significantly increases delay as the power supply voltage decreases, as compared with normal circuits. Therefore, a variable delay circuit that changes delay in accordance with the power supply voltage as described above can be implemented.

Figure 2:
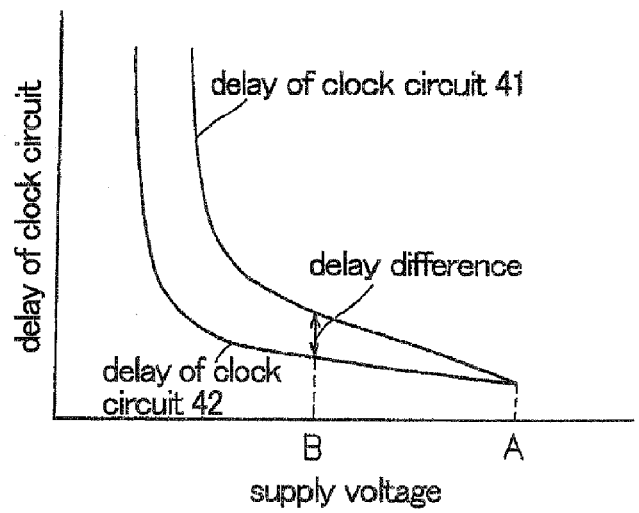
FIG. 2 shows the power supply voltage dependencies of clock circuits 41, 42.
Figure 3:
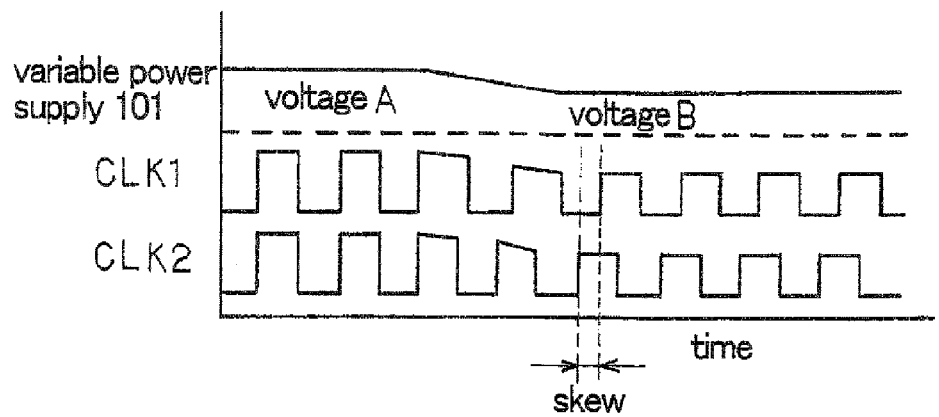
FIG. 3 is a timing chart showing operation of clock circuits 41, 42 in the conventional multi-supply-voltage semiconductor device.
Figure 4:
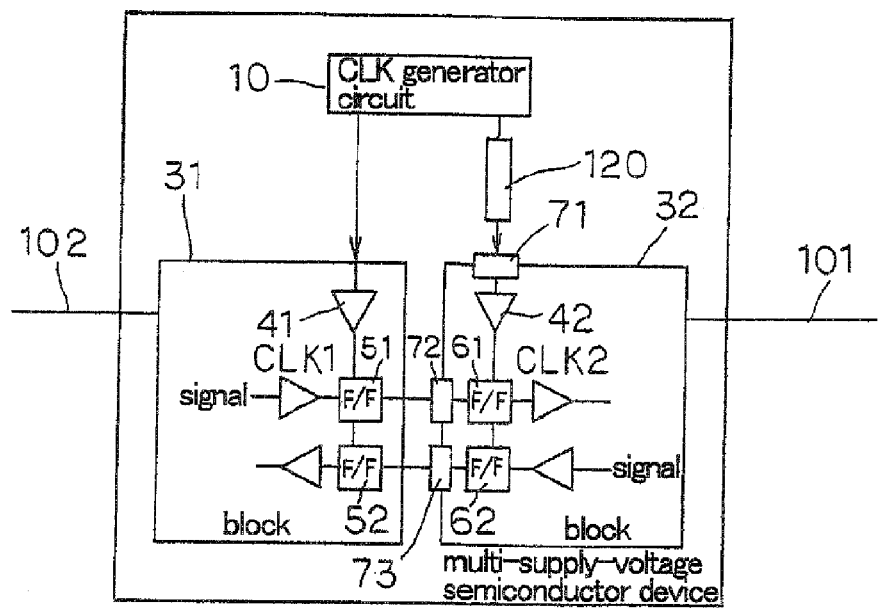
FIG. 4 is a block diagram showing a configuration of another conventional multi-supply-voltage semiconductor device.
Figure 5:
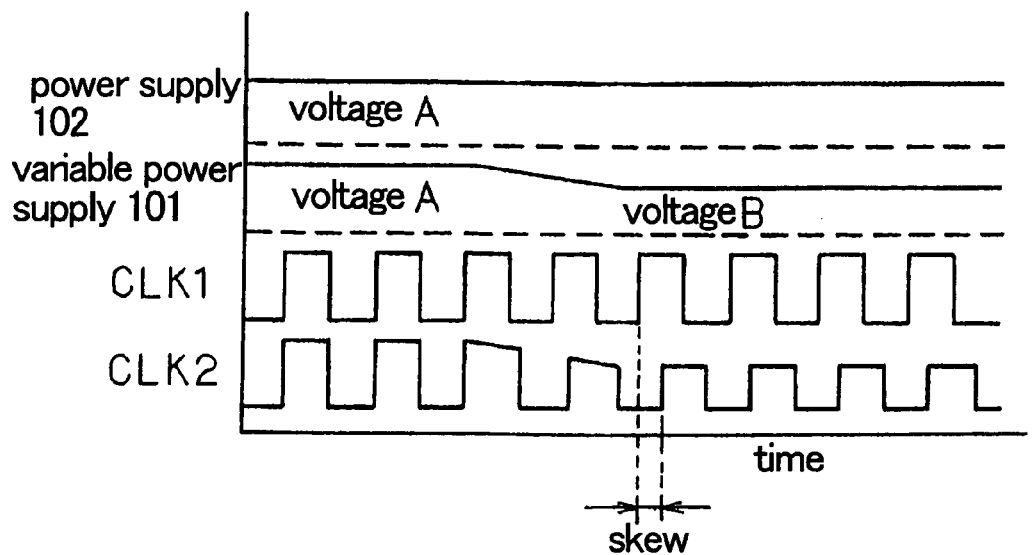
FIG. 5 is a timing chart showing operation of clock circuits 41, 42 in another conventional multi-supply-voltage semiconductor device.
Figure 10:
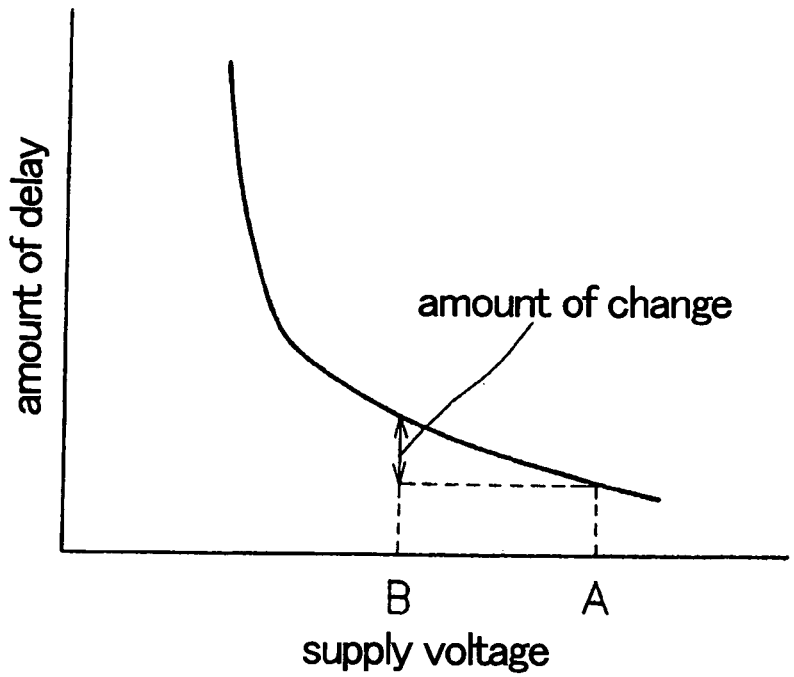
FIG. 10 shows power supply voltage versus clock circuit delay characteristics of the variable delay circuit shown in FIG. 6.

FIG. 10 shows power supply voltage versus delay characteristics in variable delay circuit 20 configured as described above. It can be seen from FIG. 10 that the amount of delay of variable delay circuit 20 increases with decreasing power supply voltage. For example, when the voltage of variable power supply 101 changes from voltage A to voltage B, the amount of delay increases by the amount of change shown in FIG. 10. Clock signal CLK2 outputted from clock circuit 42 of block 32 is delayed by the amount of change, which cancels the difference between the delay of clock circuit 41 and that of clock circuit 42 shown in FIG. 2.

Operation of the multi-supply-voltage semiconductor device according to the present invention, performed when the voltage of variable power supply 101 changes from voltage A to voltage B, will be described below with reference to a timing chart shown in FIG. 11.

Figure 11:
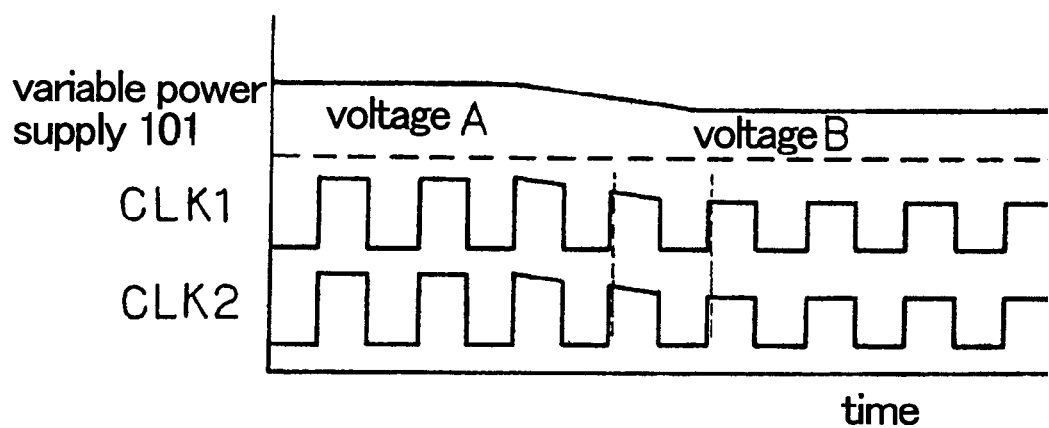
FIG. 11 is a timing chart showing operation of clock circuits 41, 42 in the multi-supply-voltage semiconductor device according to the first embodiment of the present invention.

FIG. 11 shows variable power supply 101 and clock signals CLK1, CLK2 inputted respectively into flip-flop circuits 51, 52 and 61, 62 of block 31 and 32, respectively. When variable power supply 101 is at voltage A, clock signals CLK1 and CLK2 are in phase. When the voltage of variable power supply 101 is changed from voltage A to voltage B, the supply voltage gradually decreases from voltage A to Voltage B. With this, the amplitudes and phases of clock signals CLK1, CLK2 gradually change.

On the other hand, because variable delay circuit 20 has voltage characteristics as shown in FIG. 11, the delay increases as the voltage of variable power supply 101 changes from voltage A to voltage B.

The delay of variable delay circuit 20 changes in such a manner that the difference in delay between clock circuits 41 and 42 is always compensated for as described above. Therefore, clock skew between blocks 31 and 32 can be suppressed even when the voltage value of variable power supply 101 changes. Thus, it can be ensured that a multi-supply-voltage semiconductor device which operates at a multiple power supply voltage always operates with an adequate hold margin, without having to increase the hold margin to an extremely large value at a certain power supply voltage.

While variable delay circuit 20 is provided in only one block 32 out of two blocks 31, 32 constituting the multi-power-supply semiconductor device, the variable delay circuit may be provided for some or all of the clock signals supplied from clock generator circuit 10 to the multiple blocks.

Second Embodiment

Figure 12:
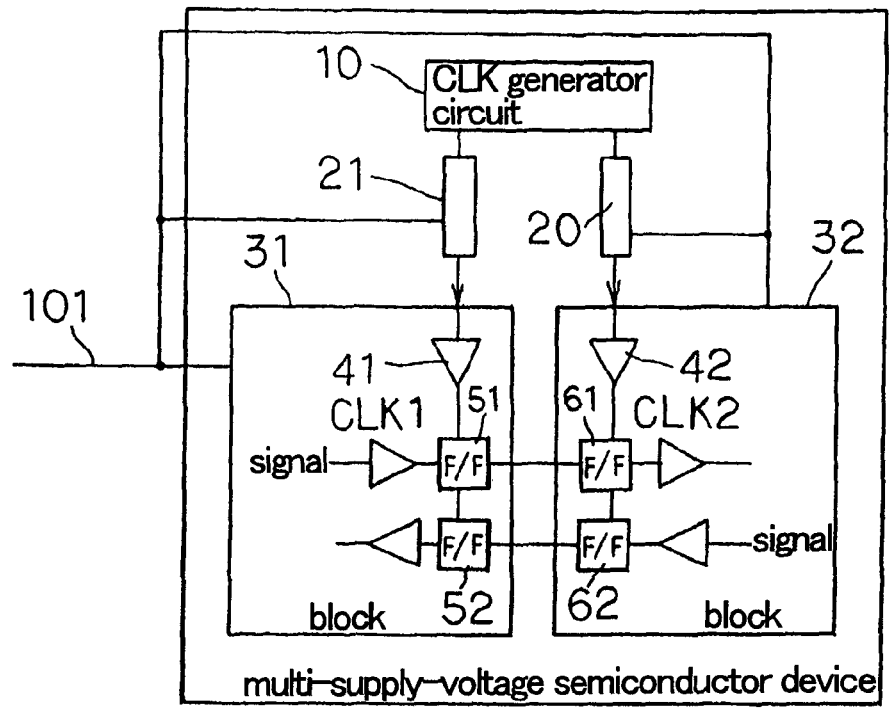
FIG. 12 is a block diagram showing a configuration of a multi-supply-voltage semiconductor device according to a second embodiment of the present invention.

A multi-supply-voltage semiconductor device according to a second embodiment of the present invention will be described below. FIG. 12 is a block diagram showing a configuration of a multi-supply-voltage semiconductor device according to the second embodiment of the present invention. Components in FIG. 12 that are the same as those in FIG. 6 are labeled the same reference numerals, the description of which will be omitted.

While the multi-supply-voltage semiconductor device in the first embodiment of the present invention descried above has a variable delay circuit provided in one of its blocks, the multi-supply-voltage semiconductor device in the second embodiment of the present invention has variable delay circuits provided in multiple or in all blocks as shown in FIG. 12.

If clock circuit 41 is formed by high-threshold transistors and clock circuit 42 is formed by low-threshold transistors, variable delay circuit 20 will be formed by high-threshold transistors as described above and variable delay circuit 21 will be formed by low-threshold transistors.

Even if a clock circuit is formed by low-threshold transistors, its delay somewhat increases as the power supply voltage decreases. Therefore, the configuration as described above enables the power supply voltage dependency of the high-threshold transistors and the power supply voltage dependency of the low-threshold transistors to cancel each other out, thereby reducing clock skew with a higher accuracy than a case where the variable delay circuit is provided in only one of the blocks.

If the multi-supply-voltage semiconductor device includes three or more blocks, a variable delay circuit can be provided in some or all of the blocks in a manner similar to that described above.

Third Embodiment

A multi-supply-voltage semiconductor device according to a third embodiment of the present invention will be described below. In the first and second embodiments described above, variable delay circuit 20 is provided to reduce clock skew due to a change in voltage of variable power supply 101 to stabilize operation of the blocks. However, a malfunction can occur if changes in delays of variable delay circuit 20 and clock circuits 41, 42 go out of synchronization while the voltage of variable power supply 101 is changing. The multi-supply-voltage semiconductor device of the third embodiment stops a clock signal supplied from clock generator circuit 10 during a change in the power supply voltage in order to stabilize operation of the blocks.

Figure 13:
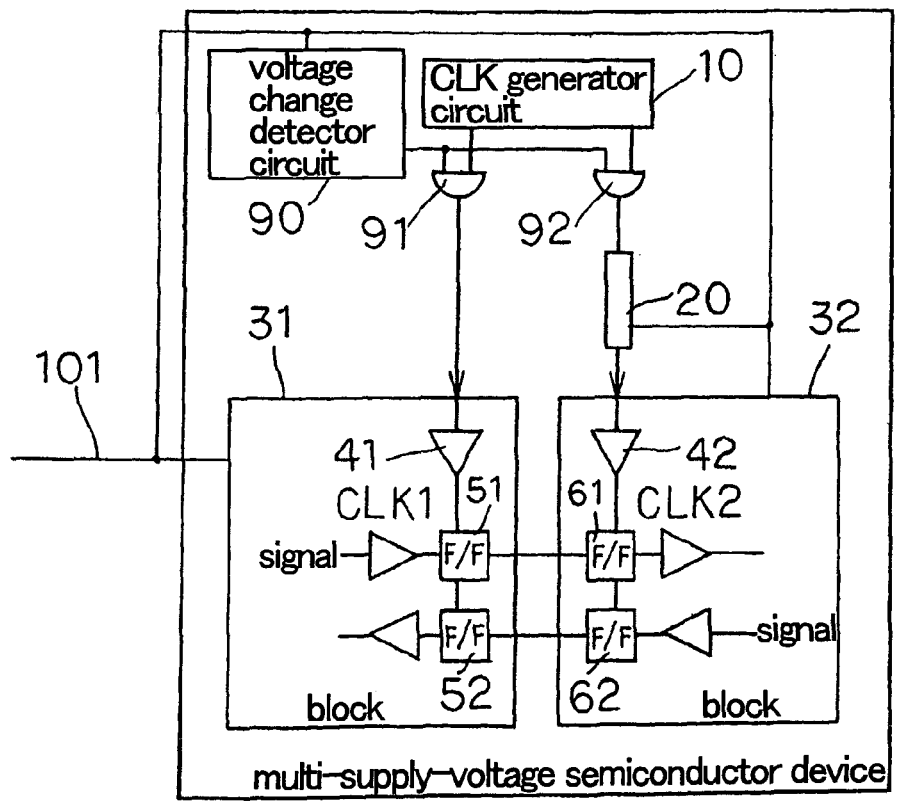
FIG. 13 is a block diagram showing a configuration of a multi-supply-voltage semiconductor device according to a third embodiment of the present invention.

The multi-supply-voltage semiconductor device of the third embodiment further includes voltage change detector circuit 90 and AND circuits 91, 92, as shown in FIG. 13, in addition to the components of the multi-supply-voltage semiconductor device of the first embodiment shown in FIG. 6.

When detecting a change in the voltage value of variable power supply 101, voltage change detector circuit 90 outputs a low-level (hereinafter denoted as L) voltage change detect signal. The voltage change detector circuit 90 keeps the voltage change detect signal at a high level (hereinafter denoted as H) while the voltage value of variable power supply 101 remains the same.

AND circuit 91 provides a clock signal from clock generator circuit 10 to clock circuit 41 of block 31 when the voltage change detect signal from voltage change detector circuit 90 is H whereas it blocks the clock signal from clock generator circuit 10 when the voltage change detect signal is L.

AND circuit 92 provides a clock signal from clock generator circuit 10 to clock circuit 42 of block 32 when the voltage change detect signal from voltage change detector circuit 90 is H whereas it blocks the clock signal from clock generator circuit 10 when the voltage change detect signal is L.

In other words, AND circuits 91, 92 function as blocking means for blocking the clock signal generated by clock generator circuit 10 from being supplied to block circuits 31, 32 for the period of time during which voltage change detector circuit 90 determines that the voltage is changing.

Figure 14:
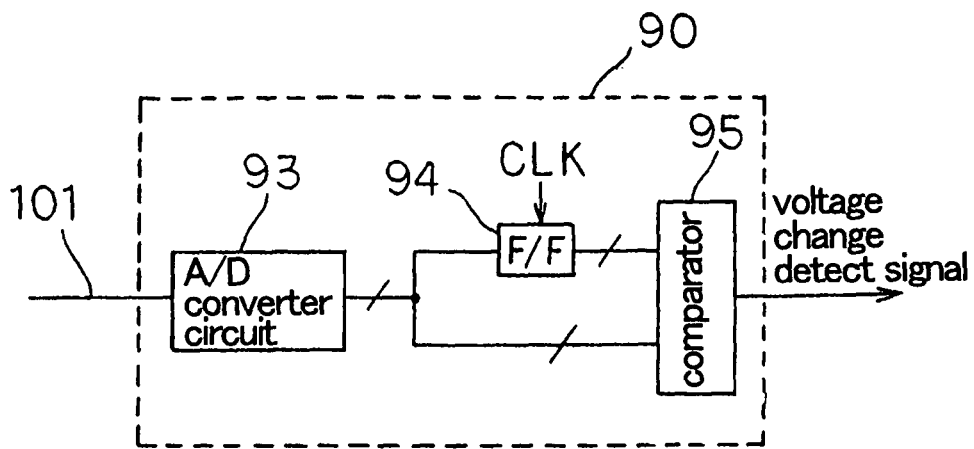
FIG. 14 is a block diagram showing a configuration of voltage change detector circuit 90 shown in FIG. 13.

Voltage change detector circuit 90 includes A/D converter circuit 93, flip-flop circuit 94, and comparator 95 as shown in FIG. 14.

A/D converter circuit 93 converts the voltage value of variable power supply 101 into digital information. Flip-flop circuit 94 holds the digital information for one cycle of a clock signal. Thus, digital information in the previous clock cycle is held in flip-flop circuit 94.

Comparator 95 compares digital information held in flip-flop circuit 94 with digital information outputted from A/D converter circuit 93. If the digital information outputted from A/D converter circuit 93 does not match the digital information held in flip-flop circuit 94, then the comparator 95 determines that variable power supply 101 is changing, and causes the voltage change detect signal to be H.

Figure 15:
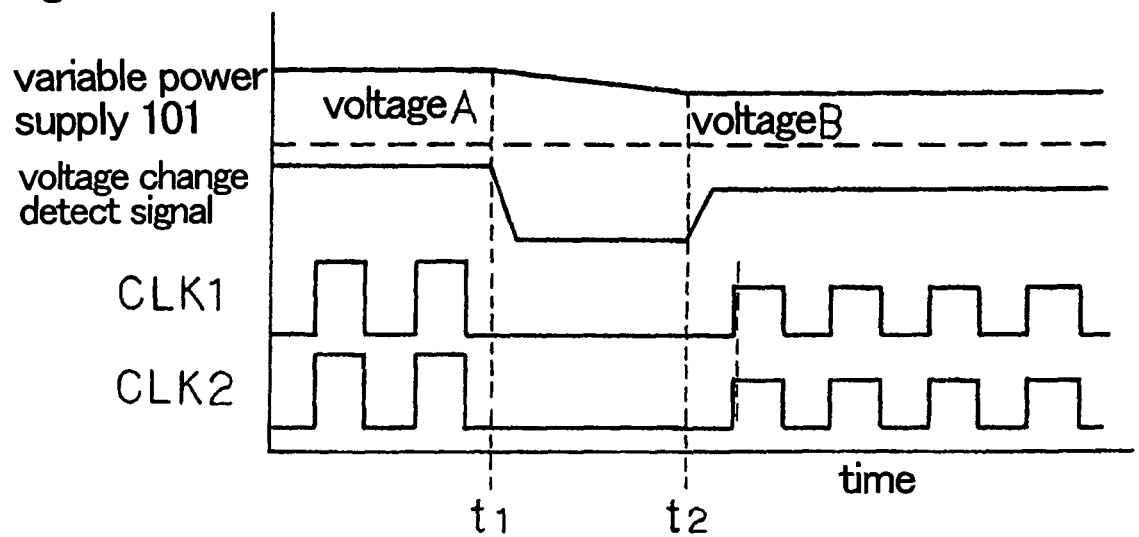
FIG. 15 is a timing chart showing operation of the voltage change detector circuit shown in FIG. 13.

FIG. 15 shows operation of the multi-supply-voltage semiconductor device according to the third embodiment. Referring to FIG. 15, when the voltage of variable power supply 101 starts to drop from voltage A, voltage change detector circuit 90 detects the voltage change and causes the voltage change detect signal to be L (at time $t_1$).

Then, AND circuits 91, 92 block the clock signal from clock generator circuit 10 from being supplied to blocks 31, 32.

When the voltage of variable power supply 101 becomes voltage B and stabilizes, voltage change detector circuit 90 causes the voltage change detect signal to be H (at time $t_2$). Accordingly, AND circuits 91, 92 start to provide the clock signal from clock generator circuit 10 to blocks 31, 32.

The multi-supply-voltage semiconductor device of the third embodiment prevents the clock signal from clock generator circuit 10 from being supplied to blocks 31, 32 while variable power supply 101 is changing, thereby preventing malfunctions in blocks 31, 32 and ensuring stable block operation.

While the third embodiment has been described with respect to a case where voltage change detector circuit 90 is provided within the multi-supply-voltage semiconductor device, voltage change detector circuit 90 may be provided externally to the multi-supply-voltage semiconductor device and only the voltage change detect signal may be inputted into the multi-supply-voltage semiconductor device.

Fourth Embodiment

A multi-supply-voltage semiconductor device according to a fourth embodiment of the present invention will be described below. In the first embodiment, variable power supply 101 is inputted into variable delay circuit 20 to control the delay of variable delay circuit 20 in an analog manner. In a multi-supply-voltage semiconductor device of the fourth embodiment, in contrast, voltage level detector circuit 96 which detects the voltage level of variable power supply 101 is provided and a variable delay circuit is controlled in a digital manner.

Figure 16:
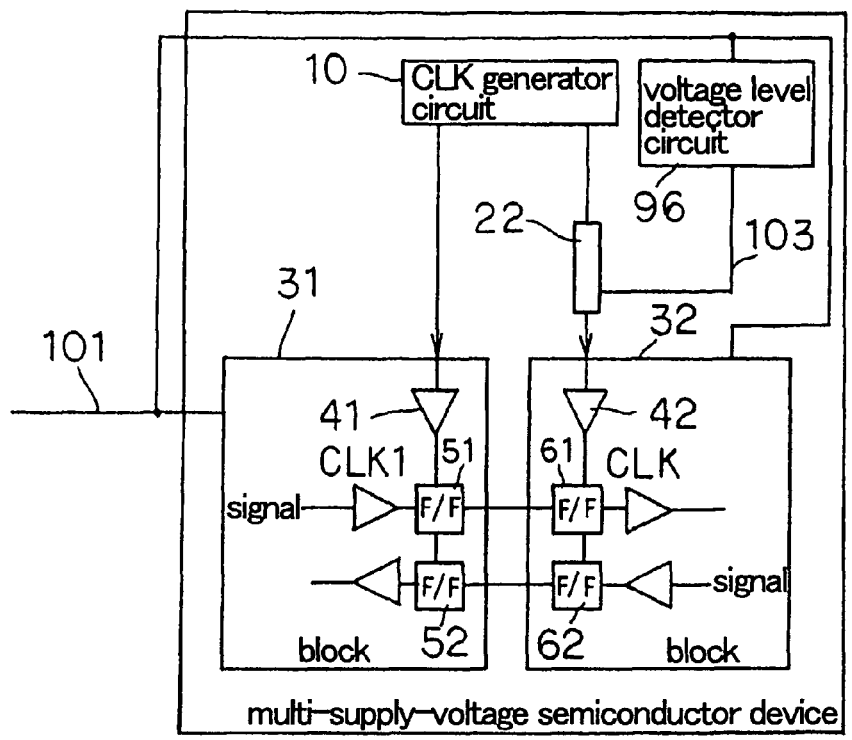
FIG. 16 is a block diagram showing a configuration of a multi-supply-voltage semiconductor device according to a fourth embodiment of the present invention.
Figure 17:
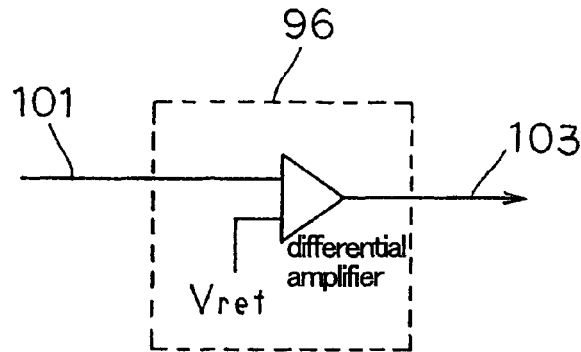
FIG. 17 shows one example of voltage level detector circuit 96 shown in FIG. 16.

FIG. 16 shows the configuration of the multi-supply-voltage semiconductor device according to the fourth embodiment. Components in FIG. 16 that are the same as those in FIG. 6 are labeled the same reference numerals, the description of which will be omitted.

As compared with the multi-supply-voltage semiconductor device of the first embodiment shown in FIG. 6, the multi-supply-voltage semiconductor device of the fourth embodiment further includes voltage level detector circuit 96 and has variable delay circuit 22 in place of variable delay circuit 20.

Voltage level detector circuit 96 detects the voltage level of variable power supply 101 and outputs it as voltage level detect signal 103, which is digital information. Variable delay circuit 22 in the fourth embodiment changes delay on the basis of voltage level detect signal 103.

The simplest configuration of voltage level detector circuit 96 can be implemented by a differential amplifier into which variable power supply 101 and a reference voltage Vref are inputted. In this case, voltage level detect signal 103 is 1-bit digital information which is H or L.

Figure 18:
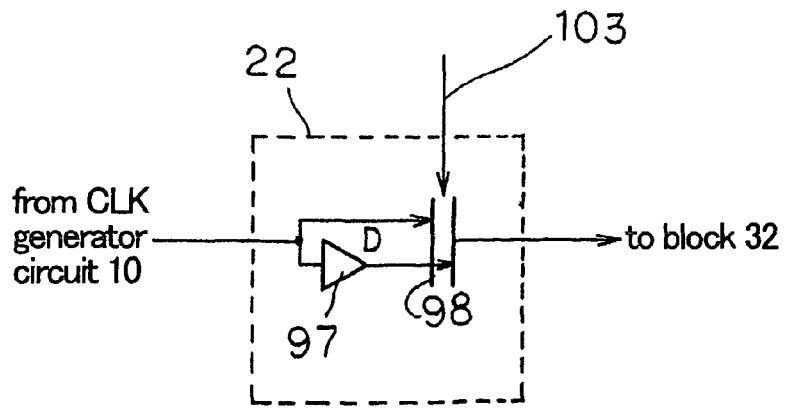
FIG. 18 shows an exemplary configuration of variable delay circuit 22 shown in FIG. 16.
Figure 19:
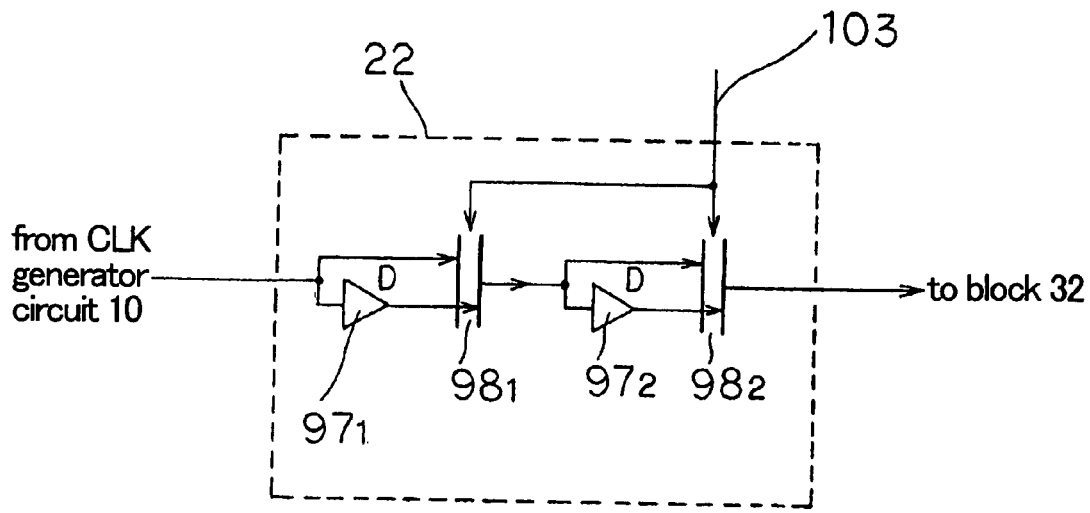
FIG. 19 shows another exemplary configuration of the variable delay circuit 22 shown in FIG. 16.

FIGS. 18 and 19 show specific examples of variable delay circuit 22 which changes the amount of delay in response to inputted 1-bit voltage level detect signal 103.

FIG. 18 shows variable delay circuit 22 consisting of delay gate 97 and selector 98.

Delay gate 97 delays a clock signal from clock generator circuit 10 by a certain amount of time. Selector 98 selects a clock signal passing through delay gate 97 or a clock signal inputted from clock generator circuit 10, in accordance with the logic of voltage level detect signal 103, and outputs it to block 32.

FIG. 19 shows variable delay circuit 22 consisting of two delay gates $97_1$, $97_2$ and two selectors $98_1$, $98_2$.

The configuration shown in FIG. 19 in which two sets of delay gate 97 and selector 98 shown in FIG. 18 are interconnected can be used in a case where delay provided by a single delay gate does not suffice.

Figure 20:
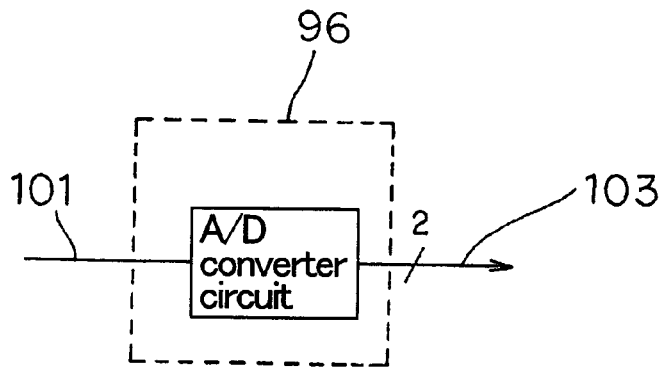
FIG. 20 shows another example of voltage level detector circuit 96 shown in FIG. 16.

FIG. 20 shows a configuration of voltage level detector circuit 96 in which voltage level detect signal 103 consists of more than one bit. In FIG. 20, voltage level detector circuit 96 is implemented by an A/D converter circuit which converts analog variable power supply 101 inputted into it to a digital signal. While a case where voltage level detect signal 103 consisting of 2 bits will be described for simplicity, voltage level detect signal 103 consisting of more than 2 bits may be implemented as well.

Figure 21:
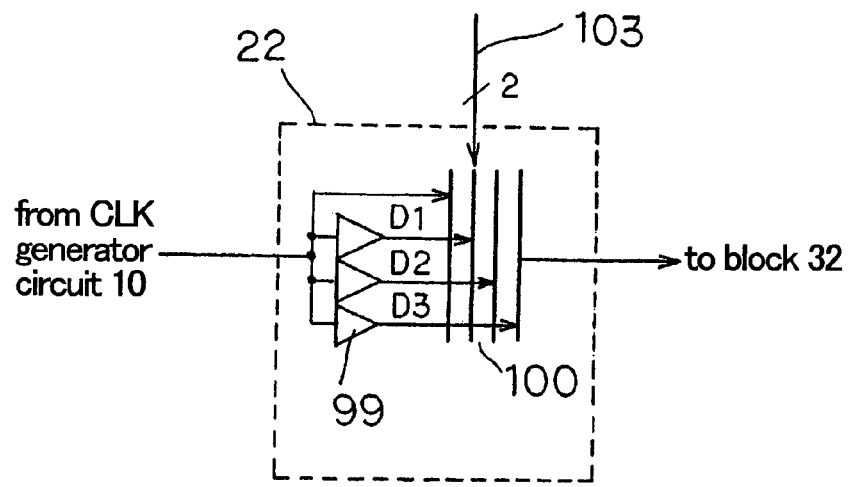
FIG. 21 shows another exemplary configuration of variable delay circuit 22 shown in FIG. 16.

FIG. 21 shows a specific example of variable delay circuit 22 that changes the amount of delay in response to 2-bit voltage level detect signal 103 that has been inputted.

Shown in FIG. 21 is variable delay circuit 22 including delay gate 99 and selector 100.

Delay gate 99 has three parallel-connected delay circuits D1, D2, D3 providing different delays. Selector 100 selects one of a clock signal provided from clock generator circuit 10 and clock signals that have passed delay circuits D1, D2, D3 and outputs it to block 32.

Delay gates 97, $97_1$, $97_2$, 99 described above can be implemented by a multistage inverter.

While the present embodiment has been described in which voltage level detector circuit 96 is provided within the multi-supply-voltage semiconductor device, voltage level detector circuit 96 may be provided externally to the multi-supply-voltage semiconductor device and only the voltage level detect signal may be inputted into the multi-supply-voltage semiconductor device.

Fifth Embodiment

A multi-supply-voltage semiconductor device according to a fifth embodiment of the present invention will be described below.

Figure 22:
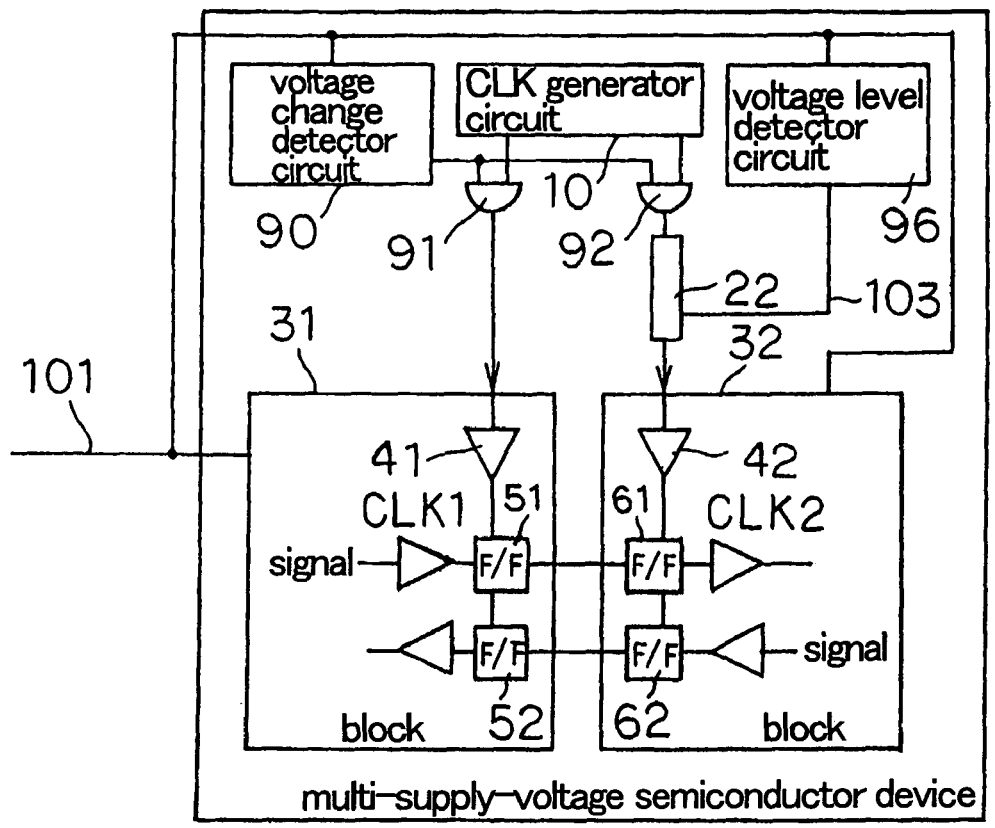
FIG. 22 is a block diagram showing a configuration of a multi-supply-voltage semiconductor device according to a fifth embodiment of the present invention.

FIG. 22 shows a multi-supply-voltage semiconductor device according to the fifth embodiment. The same components in FIG. 22 as those in FIGS. 6, 13, and 16 are labeled the same reference numerals, the description of which will be omitted.

The multi-supply-voltage semiconductor device is the combination of the third and fourth embodiments, in which voltage level detector circuit 96 is provided for performing digital control of variable delay circuit 22, voltage change detector circuit 90 is provided for blocking supply of a clock during a change in power supply voltage, thereby ensuring stable operation of blocks.

Operation of the multi-supply-voltage semiconductor device of the fifth embodiment will be described below with reference to a timing chart shown in FIG. 23.

Figure 23:
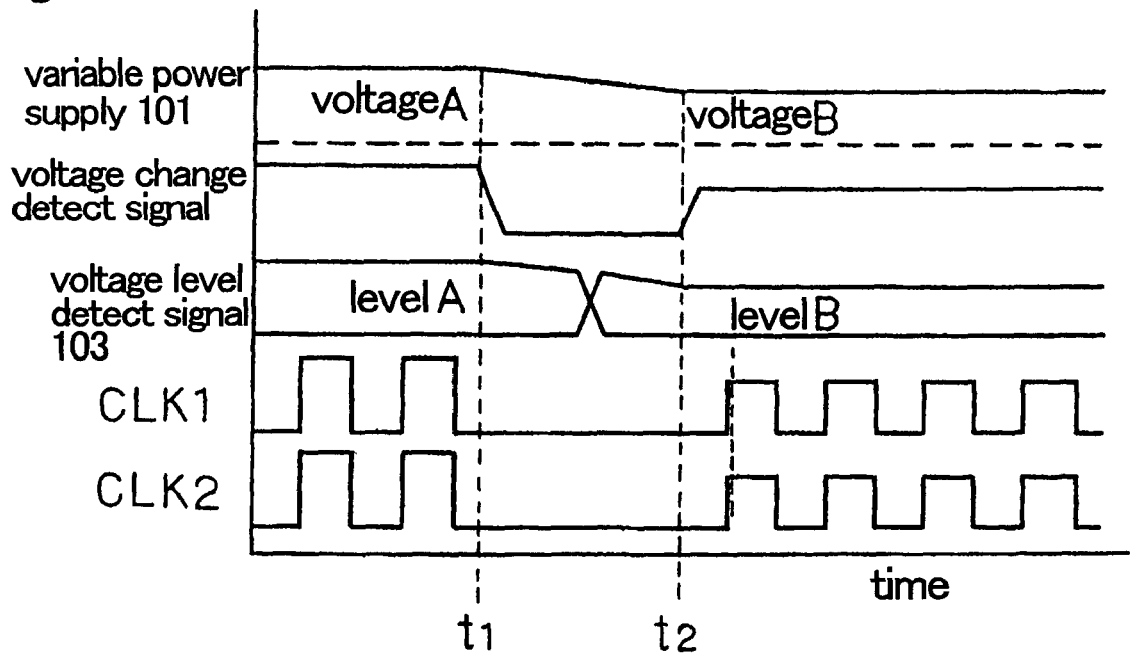
FIG. 23 is a timing chart illustrating operation of the multi-supply-voltage semiconductor device according to the fifth embodiment of the present invention.

Referring to FIG. 23, when the voltage of variable power supply 101 starts to drop from voltage A, voltage change detector circuit 90 detects the voltage change and causes a voltage change detect signal to be L (at time $t_1$).

Then, AND circuits 91, 92 block a clock signal from clock generator circuit 10 from being supplied to blocks 31, 32. The voltage value indicated by voltage level detect signal 103 outputted from voltage level detector circuit 96 during that period is also changed from voltage A to voltage B. Thus, variable delay circuit 22 changes the amount of delay according to voltage level detect signal 103.

When the voltage of variable power supply 101 changes to voltage B and becomes stable, then voltage change detector circuit 90 causes the voltage change detect signal to be high (at time $t_2$). Consequently, AND circuits 91, 92 start to supply the clock signal from clock generator circuit 10 to blocks 31, 32. By that time, the delay of variable delay circuit 22 has been changed to an amount of delay corresponding to voltage B and therefore clock signals CLK1, CLK2 outputted from clock circuits 41, 42 are in phase.

While the present invention has been described in which voltage change detector circuit 90 and voltage level detector circuit 96 are provided within the multi-supply-voltage semiconductor device, voltage change detector circuit 90 and/or voltage level detector circuit 96 may be provided externally to the multi-supply-voltage semiconductor device and the voltage change signal and/or voltage level detect signal 103 may be inputted into the multi-supply-voltage semiconductor device.

Sixth Embodiment

A multi-supply-voltage semiconductor device according to a sixth embodiment of the present invention will be described below.

Figure 24:
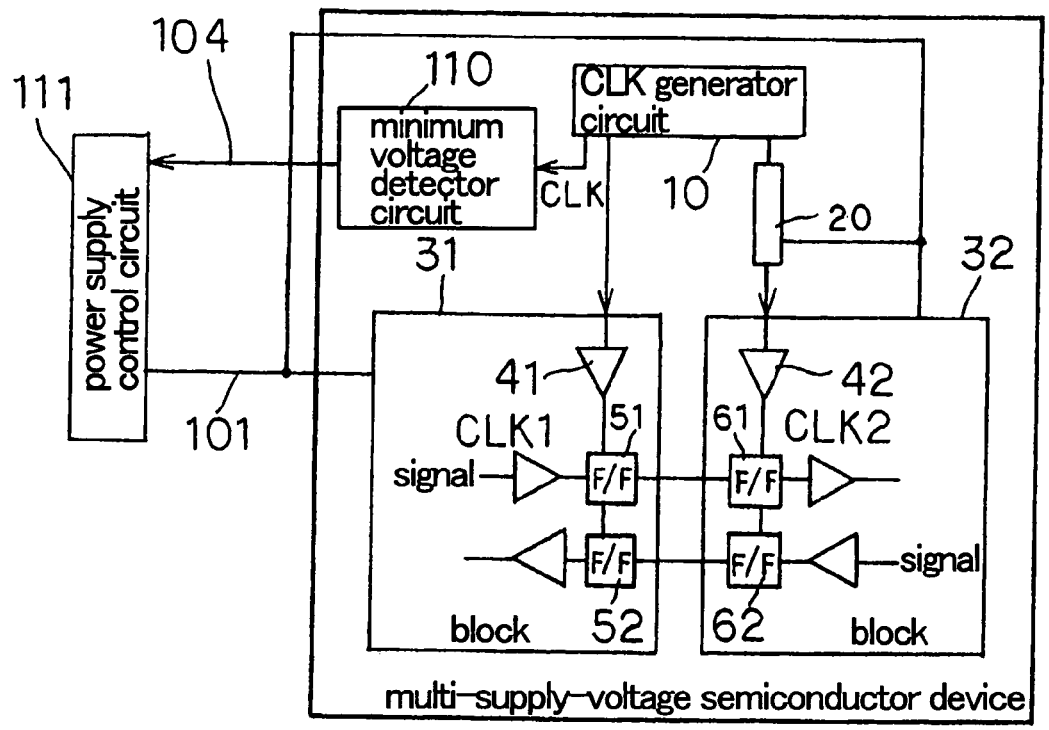
FIG. 24 is a block diagram showing a configuration of a multi-supply-voltage semiconductor device according to a sixth embodiment of the present invention.

FIG. 24 shows a multi-supply-voltage semiconductor device according to the sixth embodiment of the present invention. The same components in FIG. 24 as those in FIG. 6 are labeled the same reference numeral, the description of which will be omitted. The multi-supply-voltage semiconductor device according to the sixth embodiment includes minimum voltage detector circuit 110 in addition to the components of the multi-supply-voltage semiconductor device of the first embodiment shown in FIG. 6. Power supply control circuit 111, not shown in FIG. 6, is also shown in FIG. 24.

In the multi-supply-voltage semiconductor device according to the sixth embodiment, minimum voltage detector circuit 110 is provided, to which variable power supply 101 and a reference clock (CLK) from clock generator circuit 10 are inputted, and power supply control signal 104 is provided to external power supply control circuit 111 to control the voltage value of variable power supply 101 to be the minimum voltage that can ensure operation at the predetermined reference CLK, thereby minimizing power consumption to achieve a high power efficiency.

The path with the largest delay between flip-flops is called the critical path and the delay of the critical path is called the critical path delay. To operate properly, the critical path delay must be smaller than the period T. Conversely, as long as this condition is met, malfunctions do not occur even if the voltage of variable power supply 101 is decreased. Therefore, in the multi-supply-voltage semiconductor device of the sixth embodiment, the voltage value of variable power supply 101 is reduced to the minimum level at which critical path delay<period T can be met, thereby reducing power consumption.

Minimum voltage detector circuit 110 generates power supply control signal 140 to control the voltage value of variable voltage 101 to the lowest value within a range in which proper operation can be performed at a given clock frequency, and outputs it to power supply control circuit 111. Specifically, minimum voltage detector circuit 110 generates power supply control signal 140 and provides it to power supply control circuit 111 such that the voltage value of variable power supply 101 is reduced to a voltage within a range that ensures that one period of the clock signal generated by clock generator circuit 10 is longer than the critical path delay time.

Power supply control circuit 111 controls variable power supply 101 according to power supply control signal 140 from minimum voltage detector circuit 110.

Figure 25:
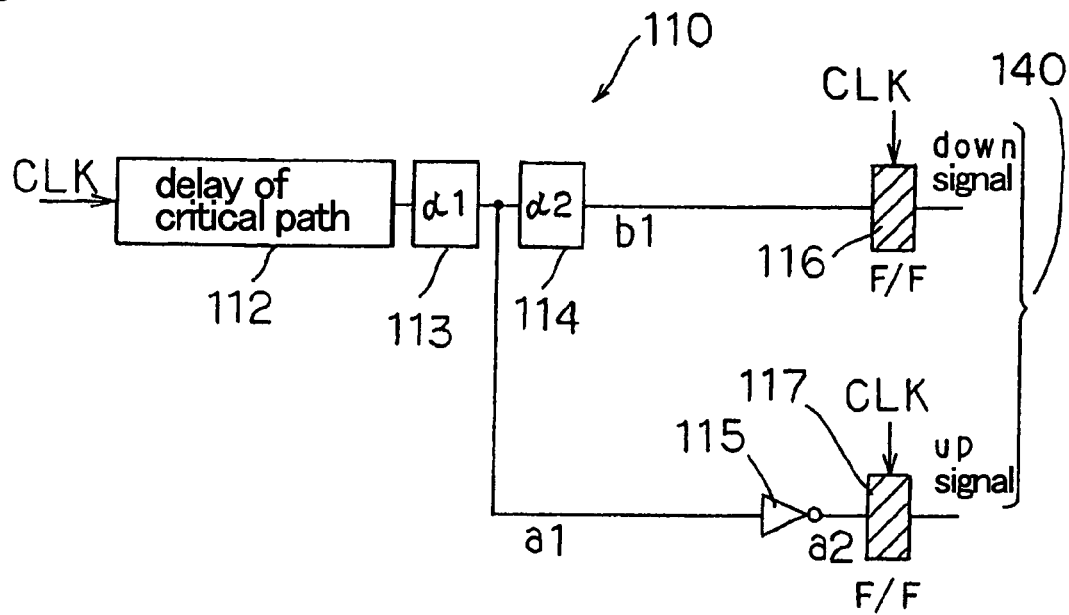
FIG. 25 is a block diagram showing a configuration of a minimum voltage detector circuit shown in FIG. 24.

FIG. 25 shows a configuration of minimum voltage detector circuit 110 in FIG. 24.

Minimum voltage detector circuit 110 includes delay circuits 112-114, inverter 115, and flop-flop circuits 116, 117. Power supply control signal 140 includes a down signal which directs power supply control circuit 111 to reduce the voltage value of variable power supply 101 and an up signal which directs power supply control circuit 111 to increase the voltage value of variable power supply 101.

Delay circuit 112 delays clock signal CLK from clock generator circuit 10 by the amount of the critical path delay and outputs delayed clock signal CLK. Delay circuits 113 and 114 delay the clock signal by delay time $\alpha 1$ and delay time $\alpha 2$, respectively, and output the signals.

By configuring minimum voltage detector circuit 110 as given above, the down and up signals can be controlled as follows:

(1) Down Signal
  a) If critical path delay+$\alpha 1$+$\alpha 2$<period T, then the signal becomes "1" causing the voltage value to be reduced.
  b) If critical path delay+$\alpha 1$+$\alpha 2 \geq$ period T, then the signal becomes "0" causing the voltage value to be kept the same.

(2) Up Signal
  a) If critical path delay+$\alpha 1$>period T, then the signal becomes "1" causing the voltage value increased.
  b) If critical path delay+$\alpha 1 \leq$ period T, then the signal becomes "0" causing the voltage value to be kept the same.

Here, $\alpha 1$ is the delay margin and $\alpha 2$ is the allowance. Thus, minimum voltage detector circuit 110 outputs power supply control signal 140 including the up and down signals to power supply control circuit 111 so that critical path delay+$\alpha 1$<period T<critical path delay+$\alpha 1$+$\alpha 2$.

Figure 26:
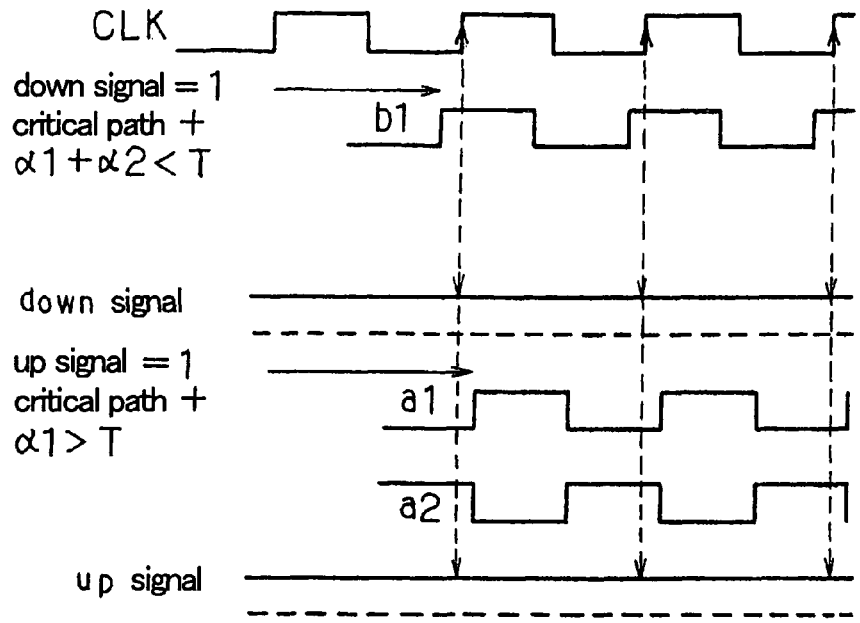
FIG. 26 is a timing chart illustrating operation of the multi-supply-voltage semiconductor device according to the fifth embodiment of the present invention.

Operation of minimum voltage detector circuit 11 according to the sixth embodiment is shown in the timing chart in FIG. 26.

Seventh Embodiment

A multi-supply-voltage semiconductor device according to a seventh embodiment of the present invention will be described below. While a variable delay circuit is used to suppress clock skew in the first to sixth embodiments described above, a phase synchronizing circuits for keeping clock signals in blocks 31 and 32 in phase with each other are provided to suppress clock skew between the blocks in the multi-supply-voltage semiconductor device according to the seventh embodiment of the present invention.

Figure 27:
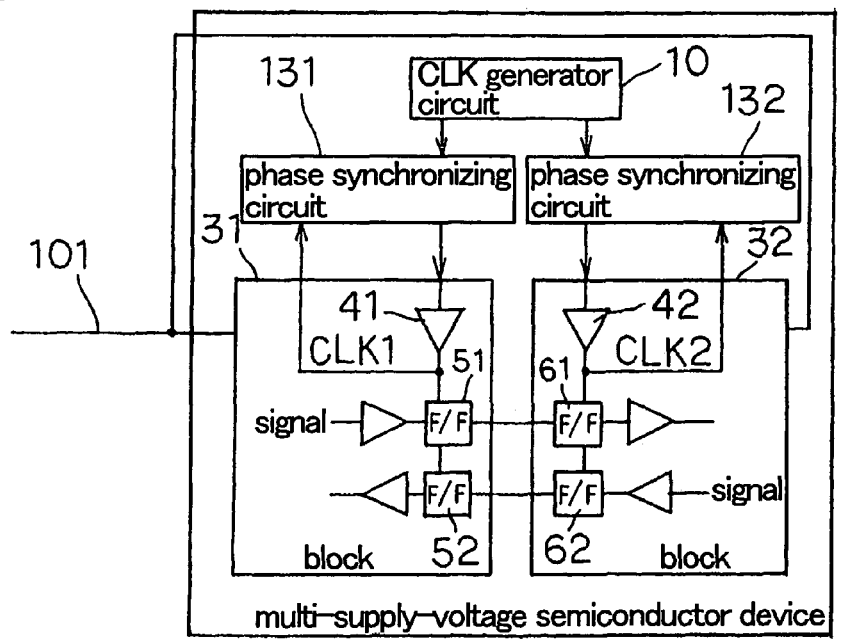
FIG. 27 is a block diagram showing a configuration of a multi-supply-voltage semiconductor device according to a seventh embodiment of the present invention.

As shown in FIG. 27, the multi-supply-voltage semiconductor device according to the seventh embodiment includes phase synchronizing circuits 131, 132 instead of variable delay circuit 20 of the multi-supply-voltage semiconductor device of the first embodiment shown in FIG. 6.

Phase synchronizing circuit 131 uses a clock signal from clock generator circuit 10 as CLK input and clock signal CLK1 generated by clock circuit 41 as reference CLK to generate a clock signal, and provides it to clock circuit 41 as a CLK output. Phase synchronizing circuit 131 adjusts the phase of the CLK output in such a manner that the CLK input and reference CLK are kept in phase.

Similarly, phase synchronizing circuit 132 adjusts the phase of a clock signal to output to clock circuit 42 in such a manner that a clock signal from clock generator circuit 10 and clock signal CLK2 generated by clock circuit 41 are kept in phase.

Figure 28:
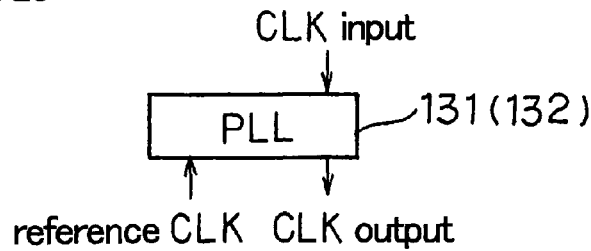
FIG. 28 shows a specific example of phase synchronizing circuits 131, 132 shown in FIG. 27.
Figure 29:
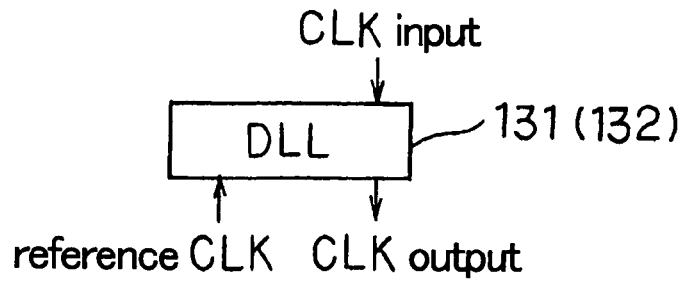
FIG. 29 shows another specific example of phase synchronizing circuits 131, 132 shown in FIG. 27.

Phase synchronizing circuits 131, 132 may be implemented by PPL (Phase Locked Loop) circuits as shown in FIG. 28 or by DDL (Delay Locked Loop) circuits as shown in FIG. 29.

Figure 30:
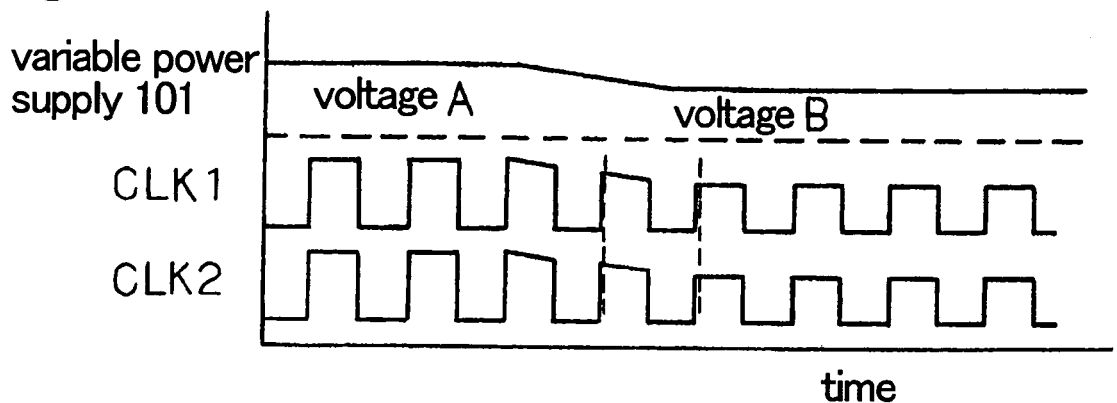
FIG. 30 is a timing chart illustrating operation of the multi-supply-voltage semiconductor device according to the seventh embodiment of the present invention.

By providing phase synchronizing circuits 131, 132 so that clock signals CLK1, CLK2 used in blocks 31, 32 are kept in phase with the clock signal generated by clock signal generator circuit 10 according to the seventh embodiment, clock signals CLK1 and CLK2 are kept in phase with each other as shown in FIG. 30 even when the voltage value of variable power supply 101 changes from voltage A to voltage B. Thus, the multi-supply-voltage semiconductor device according to the seventh embodiment can reduce clock skew between blocks 31 and 32 as with the case where a variable delay circuit is provided.

Eighth Embodiment

A multi-supply-voltage semiconductor device according to an eighth embodiment of the present invention will be described below. The multi-supply-voltage semiconductor device of the eighth embodiment has a configuration in which voltage change detector circuit 90 is provided in addition to the components of the multi-supply-voltage semiconductor device of the seventh embodiment shown in FIG. 27, so that clock output is stopped during a change in the power supply voltage.

Figure 31:
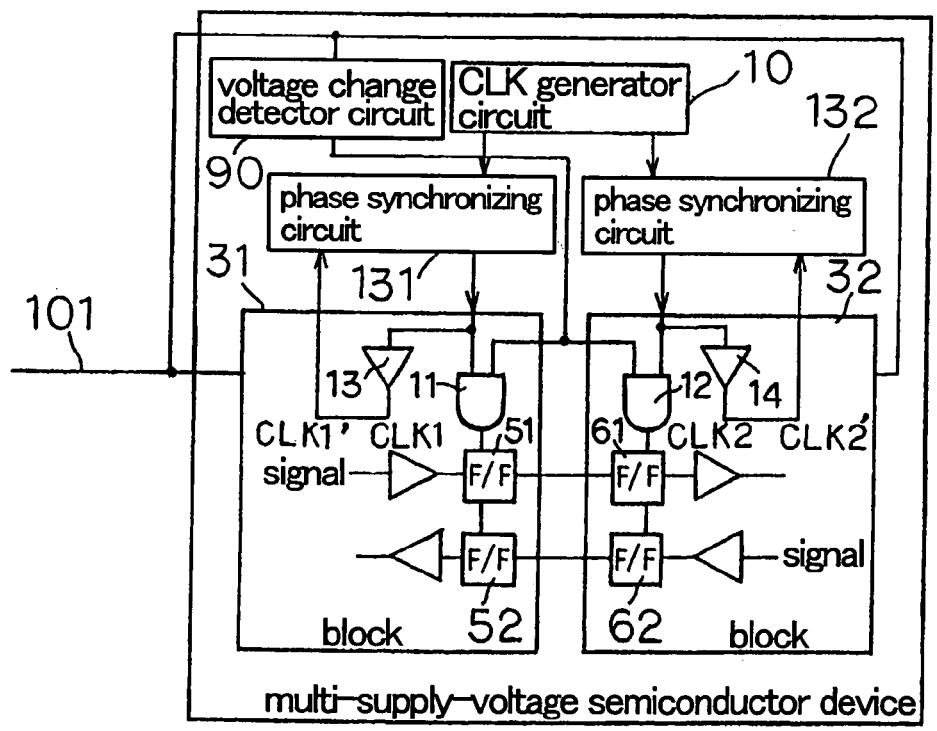
FIG. 31 is a block diagram showing a configuration of a multi-supply-voltage semiconductor device according to an eighth embodiment of the present invention.

As shown in FIG. 31, the multi-supply-voltage semiconductor device according to the eighth embodiment has AND circuits 11, 12 and buffer circuits 13, 14 provided in blocks 31, 32, respectively, instead of clock circuits 41, 42.

AND circuit 11 provides a clock signal from phase synchronizing circuit 131 as clock signal CLK1 for block 31 when a voltage change detect signal from voltage change detector circuit 90 is H, whereas it blocks the clock signal provided from phase synchronizing circuit 131 from being provided to the circuits in block 31 when the voltage change detect signal is L.

Buffer circuit 13 receives the clock signal from phase synchronizing circuit 131, changes it to clock signal CLK1', and outputs it as a reference CLK for phase synchronizing circuit 131.

AND circuit 11 and buffer circuit 13 are formed by transistors of the same type and are configured in such a manner that there is no substantial difference between them in delay due to a change in the power supply voltage. Therefore, when the voltage change detect signal is H, clock signals CLK1 and CLK1' are substantially in phase with each other irrespective of the voltage value of variably power supply 101.

Operation of AND circuit 12 and buffer circuit 14 is the same as operation of AND circuit 11 and buffer circuit 13, the description of which will therefore be omitted.

Figure 32:
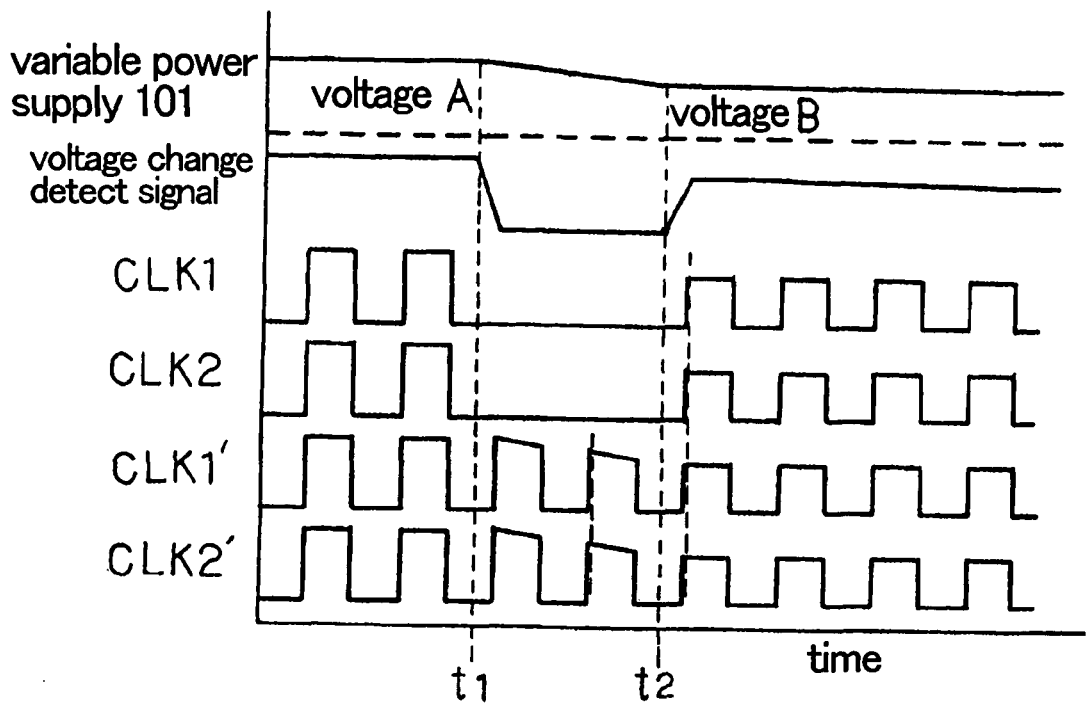
FIG. 32 is a timing chart illustrating operation of the multi-supply-voltage semiconductor device according to the eighth embodiment of the present invention.

The multi-supply-voltage semiconductor device according to the eighth embodiment can prevent malfunctions in blocks 31, 32 and ensure stable block operation by preventing the clock signal from clock generator circuit 10 from being provided to blocks 31, 32 while the variable power supply 101 is changing as shown in FIG. 32, as with the third embodiment described earlier.

While voltage change detector circuit 90 is provided in the multi-supply-voltage semiconductor device in the eighth embodiment described above, voltage change detector circuit 90 may be provided externally to the multi-supply-voltage semiconductor device and only the voltage change signal may be inputted into the multi-supply-voltage semiconductor device.

Ninth Embodiment

A multi-supply-voltage semiconductor device according to a ninth embodiment of the present invention will be described below. In the multi-supply-voltage semiconductor devices according to the first to eighth embodiments, clock generator circuit generates a clock signal having a constant frequency. In the multi-supply-voltage semiconductor device according to the ninth embodiment of the present invention, an operation mode signal indicating the current operation mode is inputted, a clock generator circuit changes the frequency of a clock signal in accordance with the operation mode signal, and the voltage value of a variable power supply also changes in accordance with the operation mode.

Figure 33:
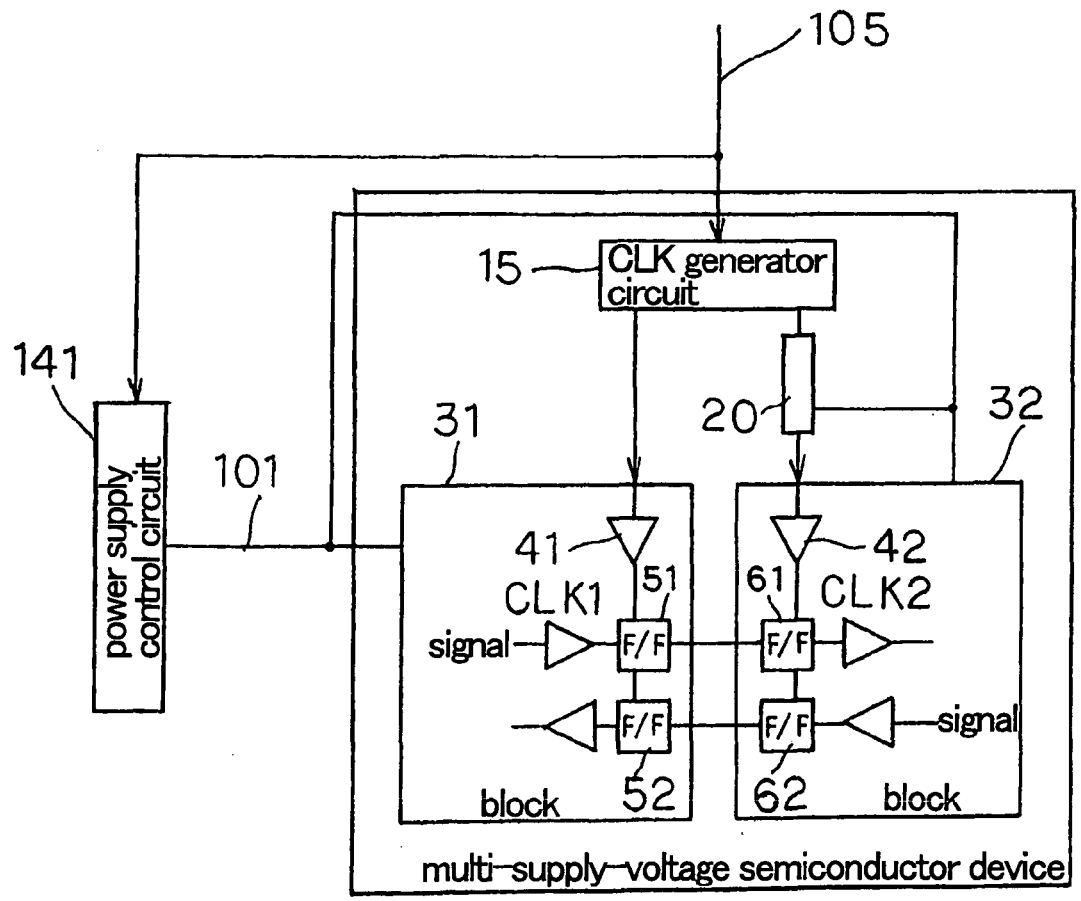
FIG. 33 is a block diagram showing a configuration of a multi-supply-voltage semiconductor device according to a ninth embodiment of the present invention.

FIG. 33 shows a configuration of the multi-supply-voltage semiconductor device according to the ninth embodiment. As shown in FIG. 33, clock generator circuit 10 of the multi-supply-voltage semiconductor device of the first embodiment is replaced with clock generator circuit 15, and power supply control circuit 141 which controls variable power supply 101 is shown. Inputted into clock generator circuit 15 and power supply control circuit 141 is operation mode signal 105 indicating the current operation mode of the multi-supply-voltage semiconductor device.

Clock generator circuit 15 controls the frequency of a clock signal to be outputted in accordance with operation mode signal 105 inputted. Power supply control circuit 141 controls the voltage value of variable power supply 101 to be outputted in accordance with operation mode signal 105 inputted.

Operation of the multi-supply-voltage semiconductor device will be described with reference to the timing chart in FIGS. 34 and 35.

Figure 34:
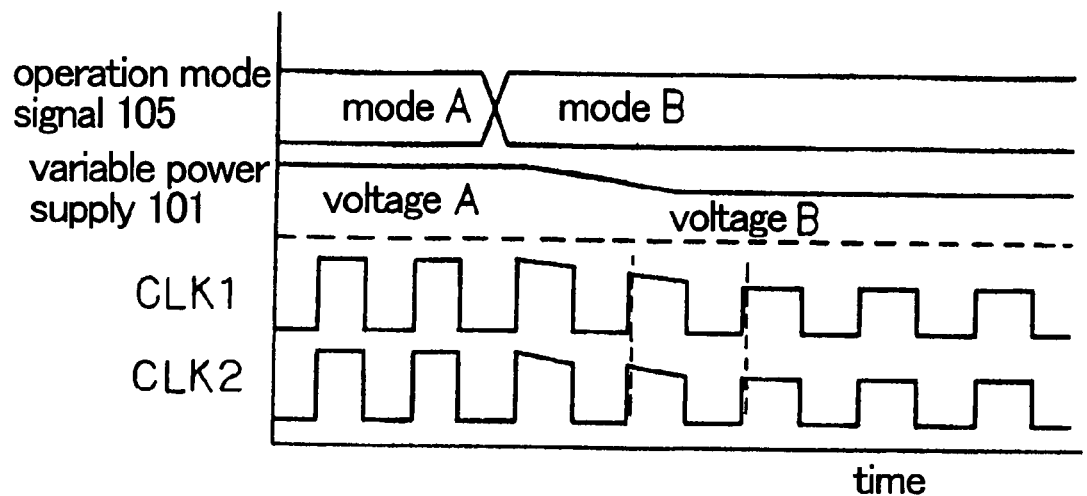
FIG. 34 is a timing chart illustrating operation for switching the operation mode from mode A to mode B in the multisupply-voltage semiconductor device according to the eighth embodiment of the present invention.

FIG. 34 shows an operation when the operation mode is changed from mode A to mode B. When operation mode signal 105 changes from mode A to mode B, clock generator circuit 15 reduces the frequency of the clock signal to be outputted and power supply control circuit 141 reduces the voltage of variably power supply 101. In doing so, clock generator circuit 15 reduces the clock frequency before the voltage of variable power supply 101 decreases from voltage A to voltage B.

Figure 35:
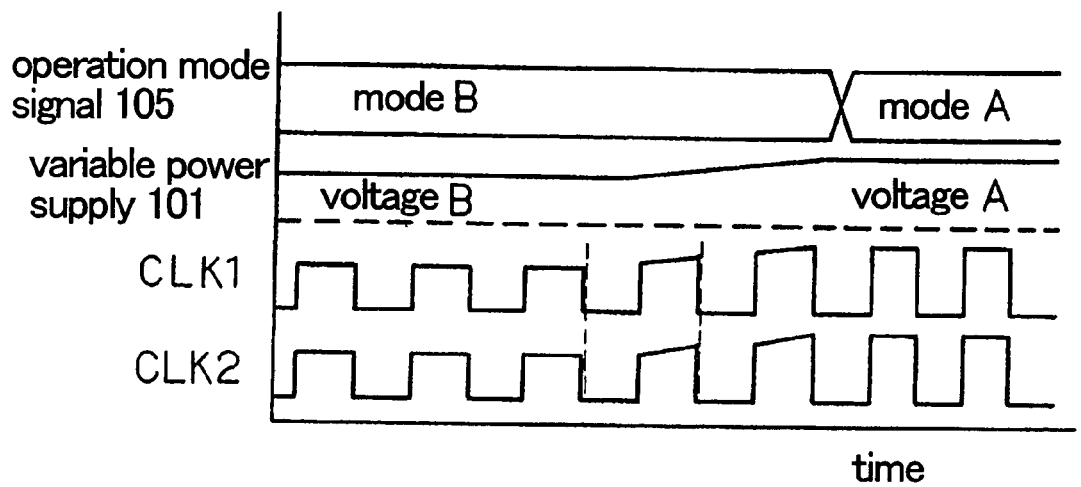
FIG. 35 is a timing chart illustrating operation for switching the operation mode from mode B to mode A in the multi-supply-voltage semiconductor device according to the eighth embodiment of the present invention.

FIG. 35 shows an operation when the operation mode is changed from mode B to mode A. When operation mode signal 105 changes from mode B to mode A, clock generator circuit 15 increases the frequency of the clock signal to be outputted and power supply control circuit 141 increases the voltage of variably power supply 101. In doing so, clock generator circuit 15 increases the clock frequency after the voltage of variable power supply 101 increases from voltage B to voltage A.

In the case where the frequency of the clock signal and the voltage value of variable power supply 101 are changed in accordance with the operation mode, as in the multi-supply-voltage semiconductor device of the ninth embodiment, the provision of variable delay circuit 20 can prevent clock signals from going out of phase due to changes in voltage and frequency, thereby clock skew between blocks 31 and 32 can be suppressed.

As in the third embodiment shown in FIG. 13, voltage change detector circuit 90 may be provided or a voltage change detect signal may be inputted from the outside to control the timing for changing the frequency as in the ninth embodiment. In that case, a stable operation can be ensured by changing the frequency after the supply voltage transition is completed.

Figure 36:
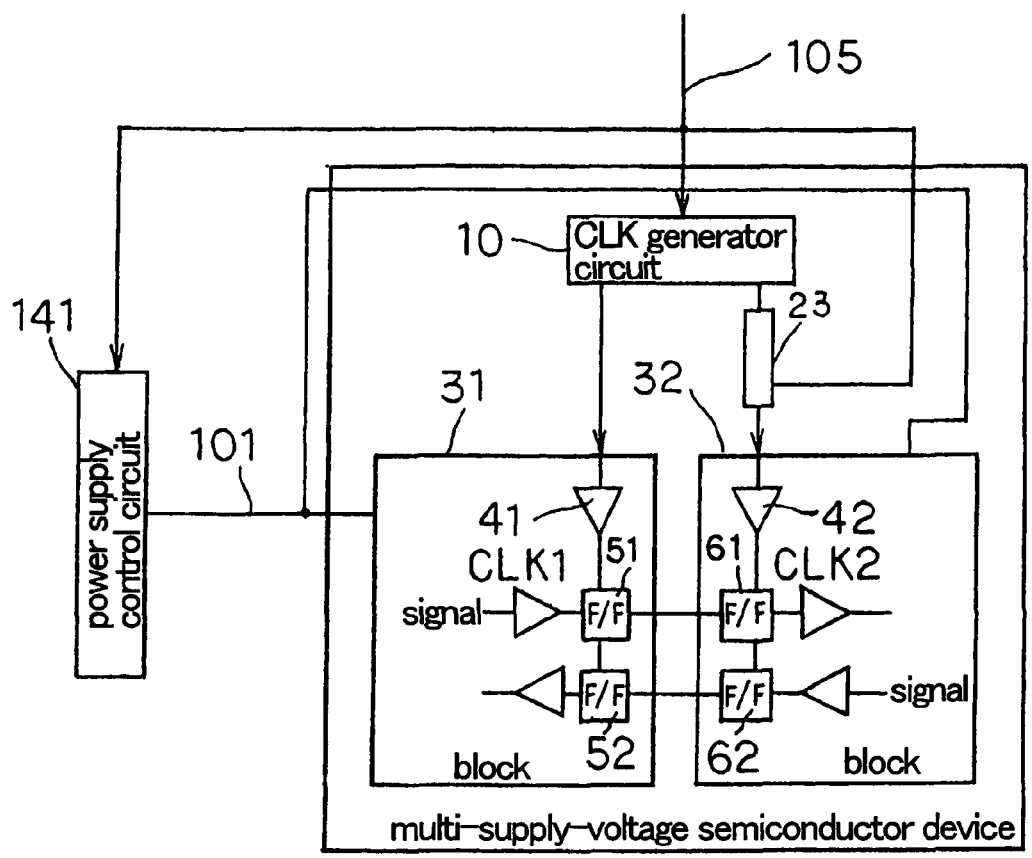
FIG. 36 is a block diagram showing another configuration of the multi-supply-voltage semiconductor device according to the ninth embodiment of the present invention.

Furthermore, as shown in FIG. 36, variable delay circuit 23 that changes the amount of delay in accordance with operation mode signal 105 can be used in place of variable delay circuit 20 that changes the amount of delay in accordance with the voltage of variable power supply 101, to directly control the amount of delay with operation mode signal 105. When an operation mode is determined, the voltage value of variable power supply 101 in that operation mode is also determined. Therefore, the amount of delay can be controlled by directly inputting operating mode signal 105 into variable delay circuit 23.

Figure 37:
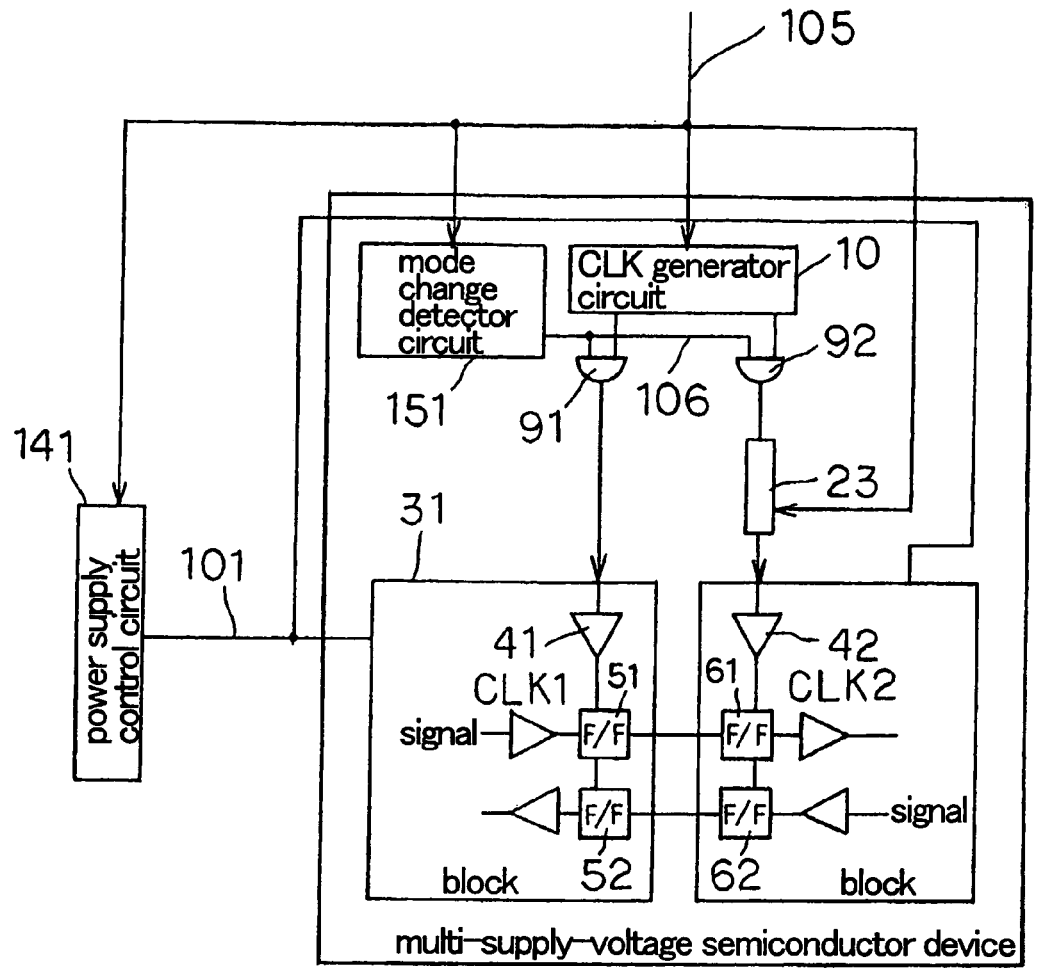
FIG. 37 is a block diagram showing yet another configuration of the multi-supply-voltage semiconductor device according to the ninth embodiment of the present invention.

Moreover, as shown in FIG. 37, mode change detector circuit 151 and AND circuits 91, 92 may be provided for halting clock supply during a change in the power supply voltage.

Mode change detector circuit 151 contains a timer inside and, when detecting a change of operation mode from operation mode signal 105, causes clock (CLK) control signal 106 to be L for a period set by the timer. AND circuits 91, 92 function as blocking means that provide a clock signal from clock generator circuit 10 to clock circuits 41, 42 of blocks 31, 32 when clock control signal 106 from mode change detector circuit 151 is H and blocks the clock signal from clock generator circuit 10 from being provided to block circuits 31, 32 when the clock control signal 106 becomes L. While blocking means have been described as AND circuits 91, 92 that block the clock signal provided from clock generator circuit 10 while clock control signal 106 stays L, blocking means are not limited to AND circuits 91, 92. Instead, mode change detector circuit 151 may set the clock control signal to a predetermined value when it detects an operation mode change and blocking means may block the clock signal provided from clock generator circuit 10 while clock control signal 106 remains at the predetermined value.

Figure 38:
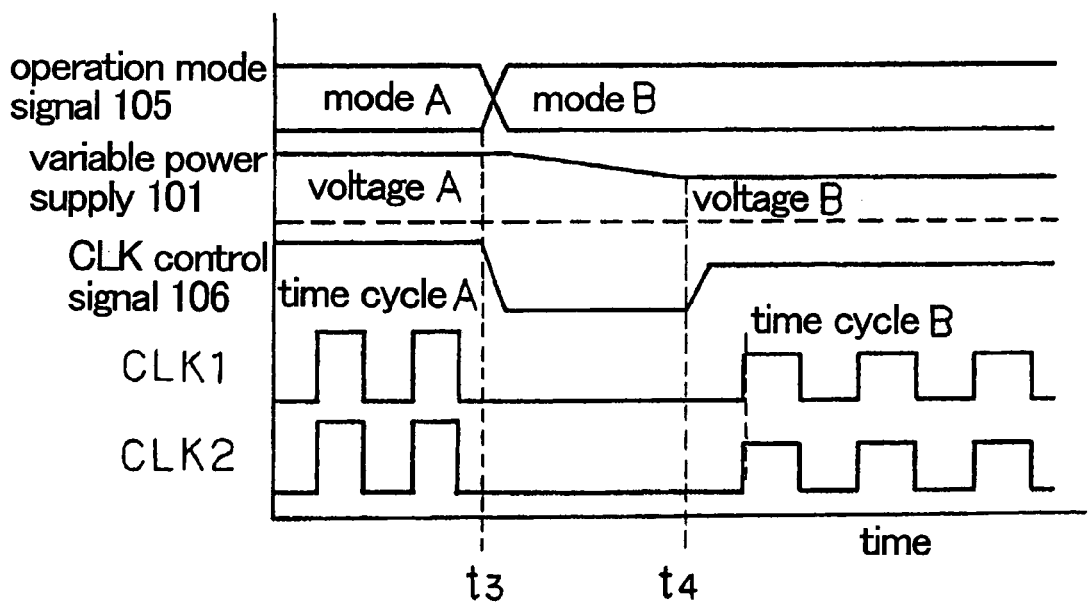
FIG. 38 is a timing chart illustrating operation of the multi-supply-voltage semiconductor device according to the ninth embodiment of the present invention shown in FIG. 37.

Operation of a multi-supply-voltage semiconductor device including such mode change detector circuit 152 will be described with reference to the timing chart in FIG. 38.

When operation mode signal 105 change from mode A to mode B, mode change detector circuit 151 causes clock control signal 106 to be L (at time $t_3$). Consequently, AND circuits 91, 92 block a clock signal provided from clock generator circuit 10. Then, power supply control circuit 141 changes variable power supply 101 from voltage A to voltage B and clock generator circuit 10 changes the frequency of the clock signal to output.

After a given period of time elapses, mode change detector circuit 151 causes clock control signal 106 to be H (at time $t_4$). By that time, the voltage value of variable power supply 101 has changed to voltage B, the frequency of the clock signal has changed, and the change in delay of variable delay circuit 23 has also been completed. Therefore, clock signals with a stable frequency, voltage, and phase are provided to blocks 31, 32 when AND circuits 91, 92 start supplying the clock signals to blocks 31, 32.

According to the ninth embodiment, low skew clocks can be readily achieved in any operation modes because the variable delay circuit is controlled in accordance with the operation mode as described above. It should be noted that information such as information about changes among chips and operating conditions (such as a change in temperature and power supply) can be taken into consideration in addition to operation mode.

Tenth Embodiment

A multi-supply-voltage semiconductor device according to a tenth embodiment of the present invention will be described below. While variable power supply 101 is supplied to both blocks 31 and 32 in the multi-supply-voltage semiconductor devices according to the first to ninth embodiments described above, the tenth embodiment of the present invention will be described with respect to a case where power supply 102 with a constant voltage value is inputted into block 31 and variable power supply 101 is inputted into block 32 as shown in FIG. 39.

Figure 39:
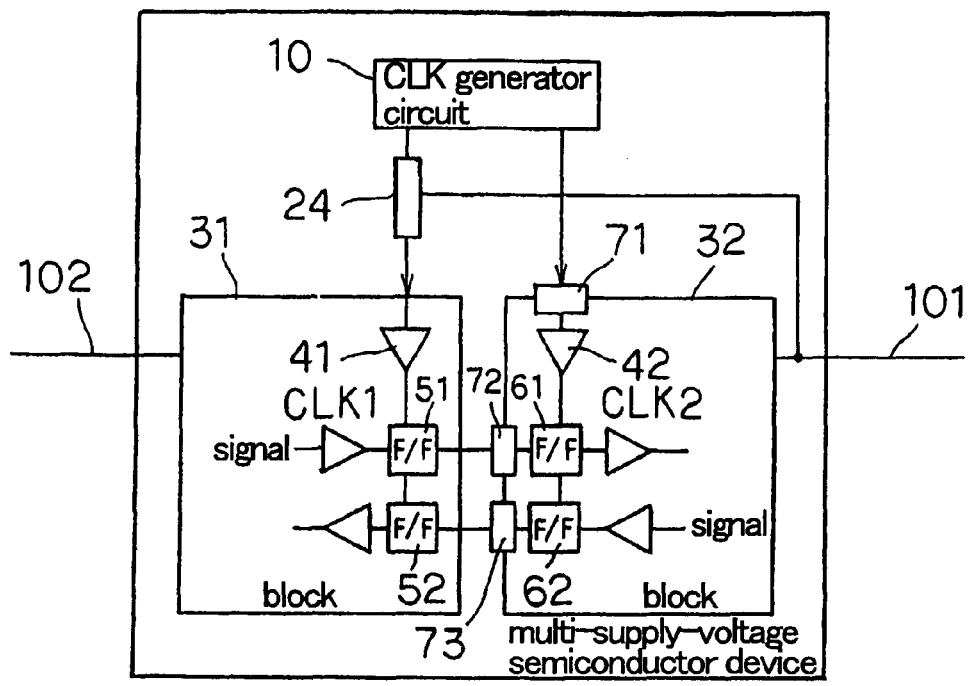
FIG. 39 is a block diagram showing a configuration of a multi-supply-voltage semiconductor device according to a tenth embodiment of the present invention.

The multi-supply-voltage semiconductor device according to the tenth embodiment has variable power supply 101 connected to block 32 and variable delay circuit 24 provided between clock generator circuit 10 and block 31 as shown in FIG. 39. Also, level shifters 71-73 are provided along the boundary of block 32 for adjusting signal levels at the interface between the blocks supplied with different supply voltages. Variable delay circuit 24 is a delay circuit that increases its delay as the supply voltage decreases.

Figure 40:
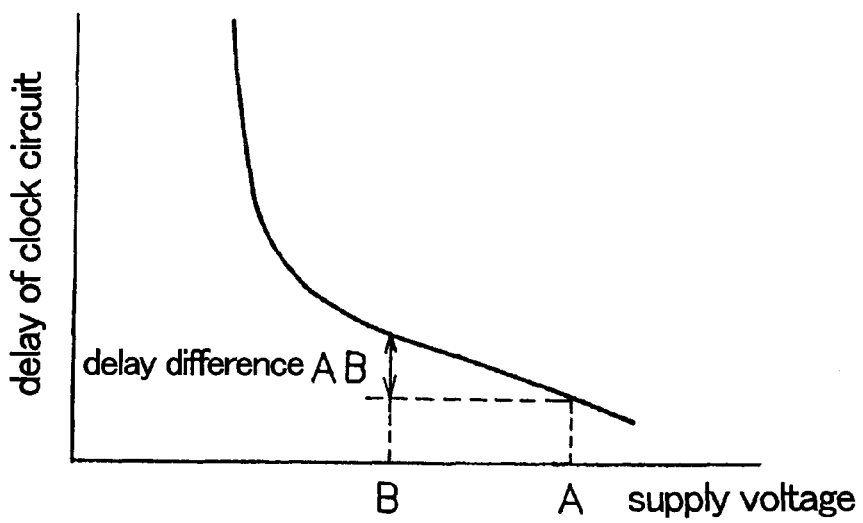
FIG. 40 shows the power supply voltage dependency of the amount of delay of a clock circuit.

When the supply voltage changes, the amounts of delay of clock circuits 41, 42 change. However, the amount of delay of clock circuit 41 is constant because the voltage of power supply 1 inputted into clock circuit 41 does not change. Because variable power supply 101 is inputted into clock circuit 42, the delay of clock 42 changes as the voltage value of variable power supply 101 changes. For example, when the voltage of variable power supply 101 changes from voltage A to voltage B, the amount of delay of clock circuit 42 increases by delay difference AB as shown in FIG. 40.

Therefore, by providing variable delay circuit 24 between clock generator circuit 10 and clock circuit 41, which increases its amount of delay as the voltage decreases, an increase in the amount of delay of clock circuit 42 can be compensated for to reduce clock skew between blocks 31 and 32. Furthermore, by controlling the amount of delay of delay circuit 24 in accordance with the power supply voltage of variable power supply 101 according to the present embodiment, phase adjustment, including level shift delay change by the provision of level shifters 71-73, can be achieved.

Figure 41:
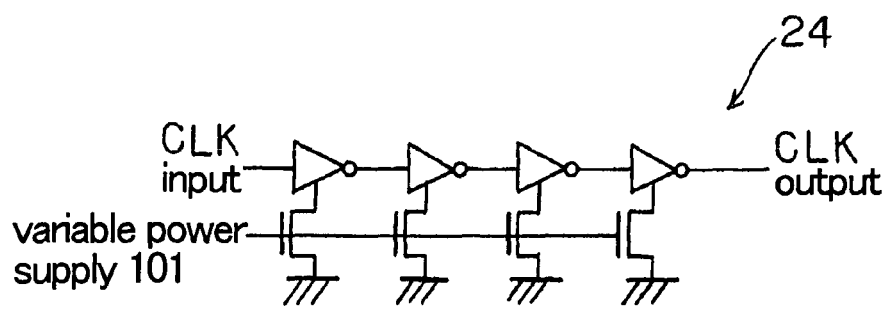
FIG. 41 shows a specific example of variable delay circuit 24 shown in FIG. 39.

FIG. 41 shows a specific example of variable delay circuit 24. Variable delay circuit 24 shown in FIG. 41 is formed by a multistage inverter in which an n-channel MOS transistor is added to the GND terminal of each inverter and variable power supply 101 is connected to the gate terminal of the n-channel MOS transistor. In variable delay circuit 24, the inverter control current is limited in order to increase the amount of delay as the voltage of variable power supply 101 decreases.

Figure 42:
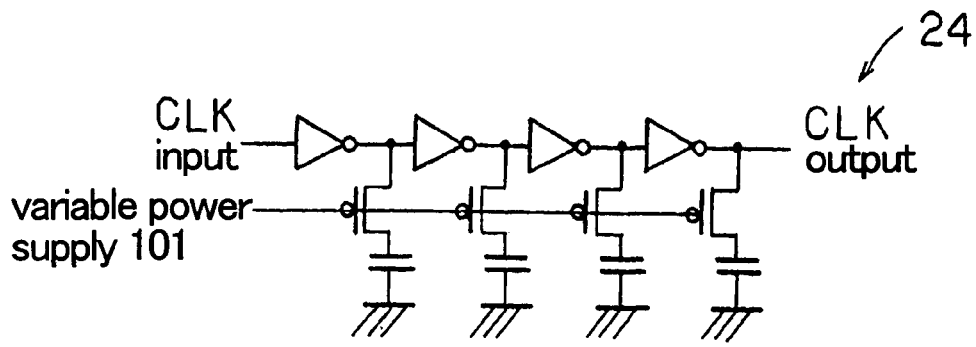
FIG. 42 shows another specific example of variable delay circuit 24 shown in FIG. 39.

FIG. 42 shows another specific example of variable delay circuit 24. Variable delay circuit 24 shown in FIG. 42 is formed by a multistage inverter in which capacitance is connected to each stage through a p-channel MOS transistor. In variable delay circuit 24, the capacitance connected to the output terminal of each inverter seems increased as the voltage of variable power supply 101 decreases, therefore the amount of delay increases.

Figure 43:
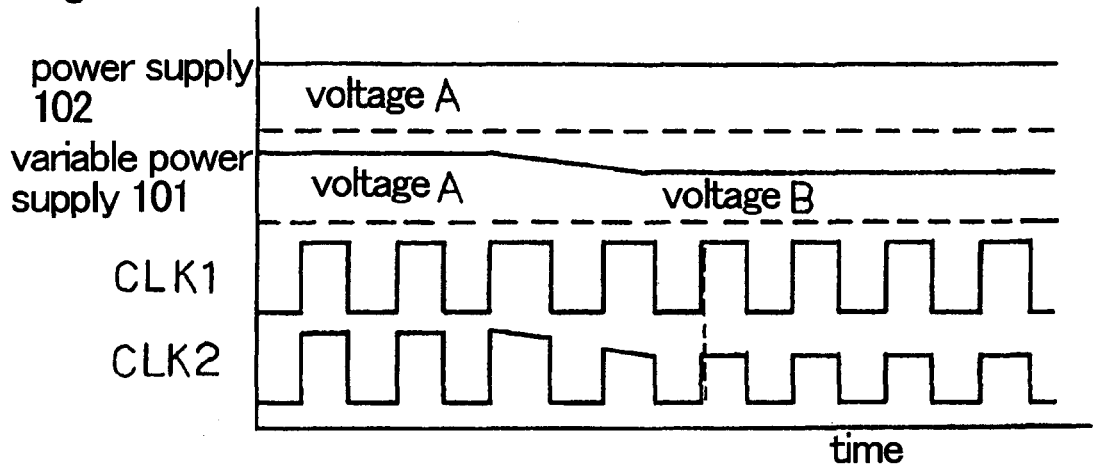
FIG. 43 is a timing chart illustrating operation of the multi-supply-voltage semiconductor device according to the tenth embodiment of the present invention.

Operation of the multiple-supply-voltage semiconductor device according to the tenth embodiment will be described below with reference to the timing chart in FIG. 43.

It is assumed here that the voltage of power supply 102 is at voltage A and variable power supply 101 is at voltage A in the initial state and subsequently the voltage of variable power supply 101 starts to change from voltage A to voltage B. As the voltage value of variable power supply 101 decreases, the amplitude of clock signal CLK2 in block 32 decreases and its phase delays. However, the phase of clock signal CLK1 is adjusted because variable delay circuit 24 is provided between clock generator circuit 10 and block 31.

As with the ninth embodiment shown in FIG. 33, operation mode signal 105 may be inputted into clock generator circuit 10 to change the clock frequency in block 32 as in the tenth embodiment. For example, the clock frequency may be reduced to half so that the leading edges are aligned.

Figure 44:
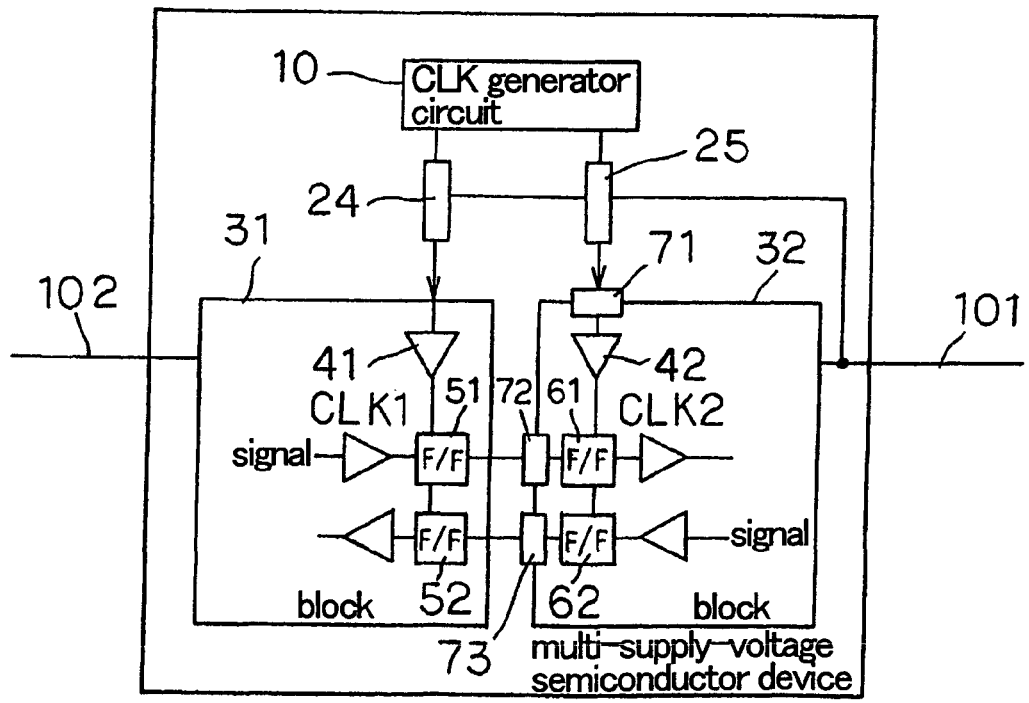
FIG. 44 is a block diagram showing another configuration of the multi-supply-voltage semiconductor device according to the tenth embodiment of the present invention.

Furthermore, variable delay circuits 24, 25 may be provided between clock generator circuit 10 and blocks 31 and between circuit 10 and block 32 respectively, as shown in FIG. 44. In this case, variable delay circuit 25 is a delay circuit that decreases its amount of delay as the power supply voltage decreases.

Figure 45:
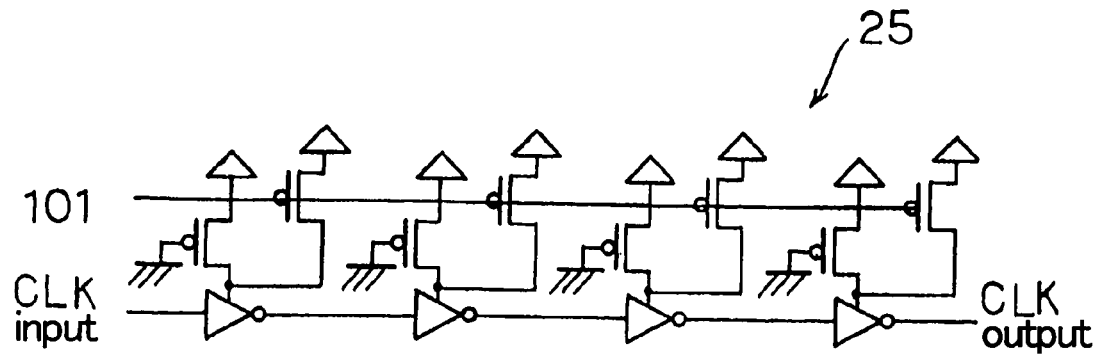
FIG. 45 shows a specific example of variable delay circuit 25 shown in FIG. 44.

FIG. 45 shows a specific example of variable delay circuit 25. Variable delay circuit 25 shown in FIG. 45 is implemented by a multistage inverter in which two p-channel MOS transistors are added to the power supply terminal of each inverter, the gate terminal of one of the p-channel MOS transistors is connected to GND and the other gate terminal is connected to variable power supply input 101. In variable delay circuit 25 configured in this way, the inverter control current increases and the amount of delay decreases as the voltage of variable power supply 101 decreases.

Figure 46:
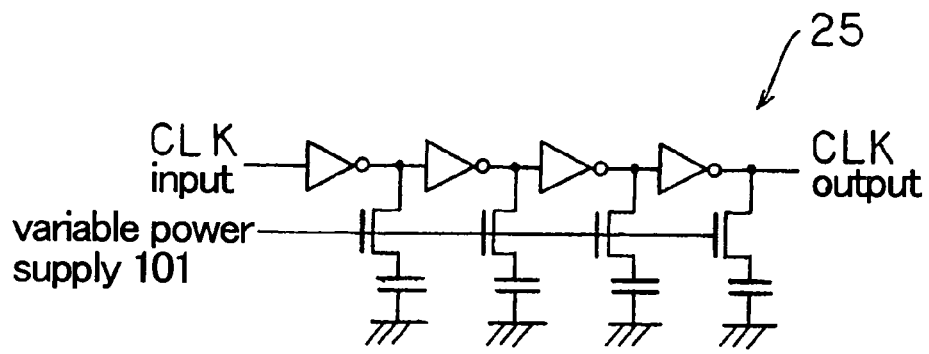
FIG. 46 shows another specific example of variable delay circuit 25 shown in FIG. 44.

FIG. 46 shows another specific example of variable delay circuit 25. Variable delay circuit 25 shown in FIG. 46 is implemented by a multistage inverter in which a capacitance is connected to each stage through a p-channel MOS transistor. In variable delay circuit 25 configured in this way, the capacitance seems decreased to each inverter as the voltage of variable power supply 101 decreases, therefore the amount of delay decreases. The variable delay circuit can be applied efficiently by having the voltage dependency characteristic opposite to that of variable delay circuits 24 shown in FIGS. 41 and 37.

Eleventh Embodiment

A multiple-supply-voltage semiconductor device according to an eleventh embodiment of the present invention will be described below. While the variable delay circuit is used to suppress clock skew when non-variable power supply 102 is inputted into block 31 and when variable power supply 101 is not inputted into block 32 in the tenth embodiment described above, phase synchronizing circuits 131, 132 shown in FIG. 27 are used for phase control to reduce clock skew between blocks 31 and 32 in the eleventh embodiment.

Figure 47:
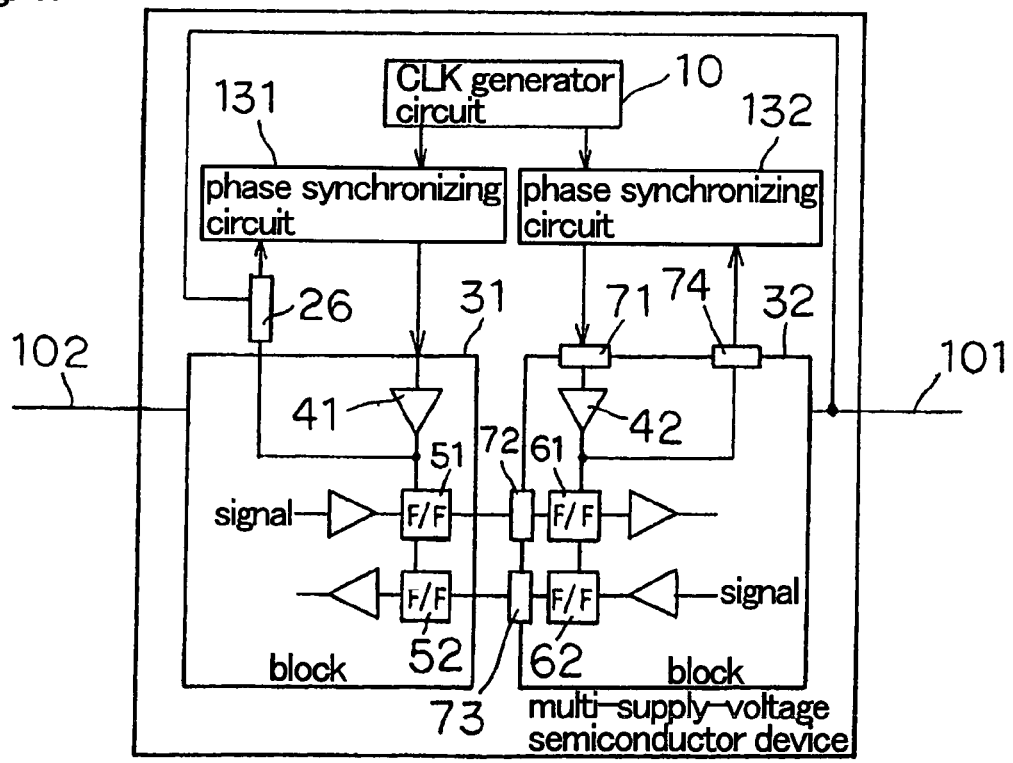
FIG. 47 is a block diagram showing a configuration of a multi-supply-voltage semiconductor device according to an eleventh embodiment of the present invention.
Figure 48:
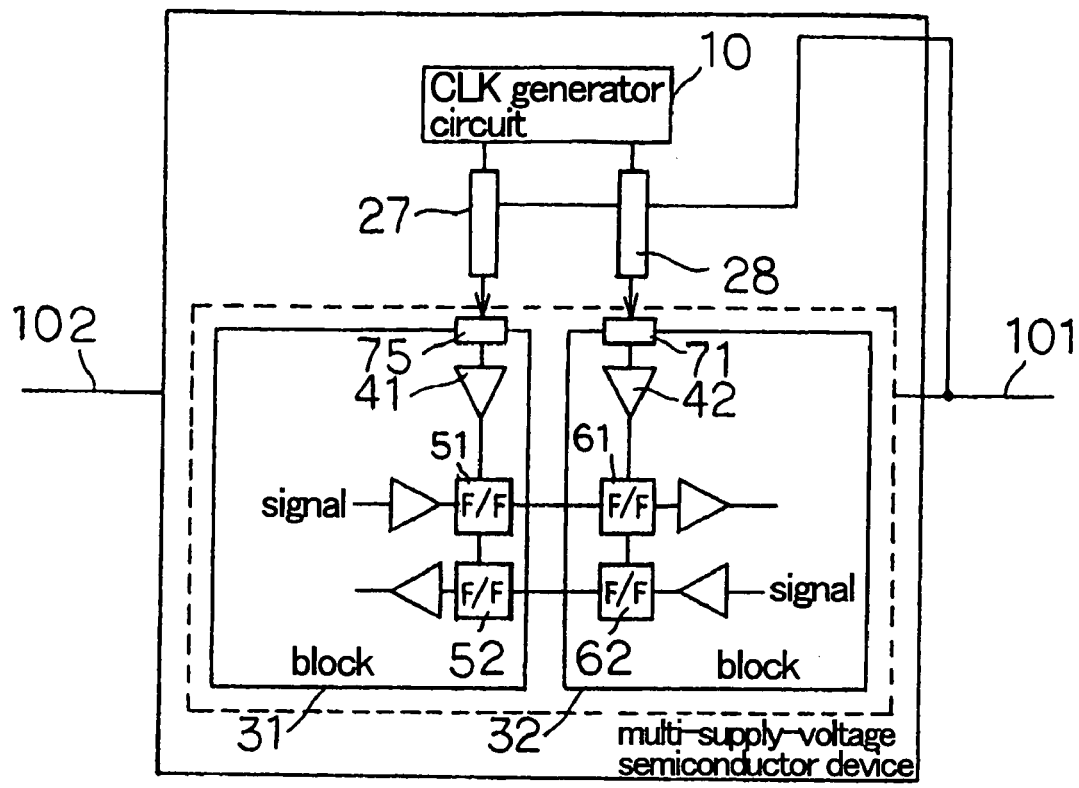
FIG. 48 is a block diagram showing a configuration of a multi-supply-voltage semiconductor device according to a twelfth embodiment of the present invention.

FIG. 47 shows a configuration of the multiple-supply-voltage device according to the eleventh embodiment. Compared with the multiple-supply-voltage semiconductor device of the tenth embodiment shown in FIG. 39, this multiple-supply-voltage semiconductor device has phase synchronization circuits 131, 132 and variable delay circuit 26 in place of variable delay circuit 24. Furthermore, level shifters 71-74 are provided in block 32 at input/output interfaces with the other circuits to adjust signal levels between the blocks supplied with different power supply voltages.

Variable delay circuit 26 is provided for compensating for delay changes of level shifters 71-74 in case such changes cause a problem. The eleventh embodiment can achieve low skew in an operation mode in which one or more block is supplied with a different power supply system by using phase synchronization circuits 131, 132 to compensate for changes in the amount of delay due to changes in power supply.

Twelfth Embodiment

A multiple-supply-voltage semiconductor device according to a twelfth embodiment of the present invention will be described below. The multiple-supply-voltage semiconductor device according to the twelfth embodiment includes two or more blocks to which variable power supply 101 is provided. The multiple-supply-voltage semiconductor device of the twelfth embodiment has variable power supply input 101 connected to blocks 31, 32, variable delay circuit 27 provided between clock generator circuit 10 and block 31, and variable delay circuit 28 provided between clock generator circuit 10 and block 32. Furthermore, level sifters 71, 75 are provided at the interfaces between block 31, 32 supplied with variable power supply input 101 and the other circuits.

Thirteenth Embodiment

Figure 49:
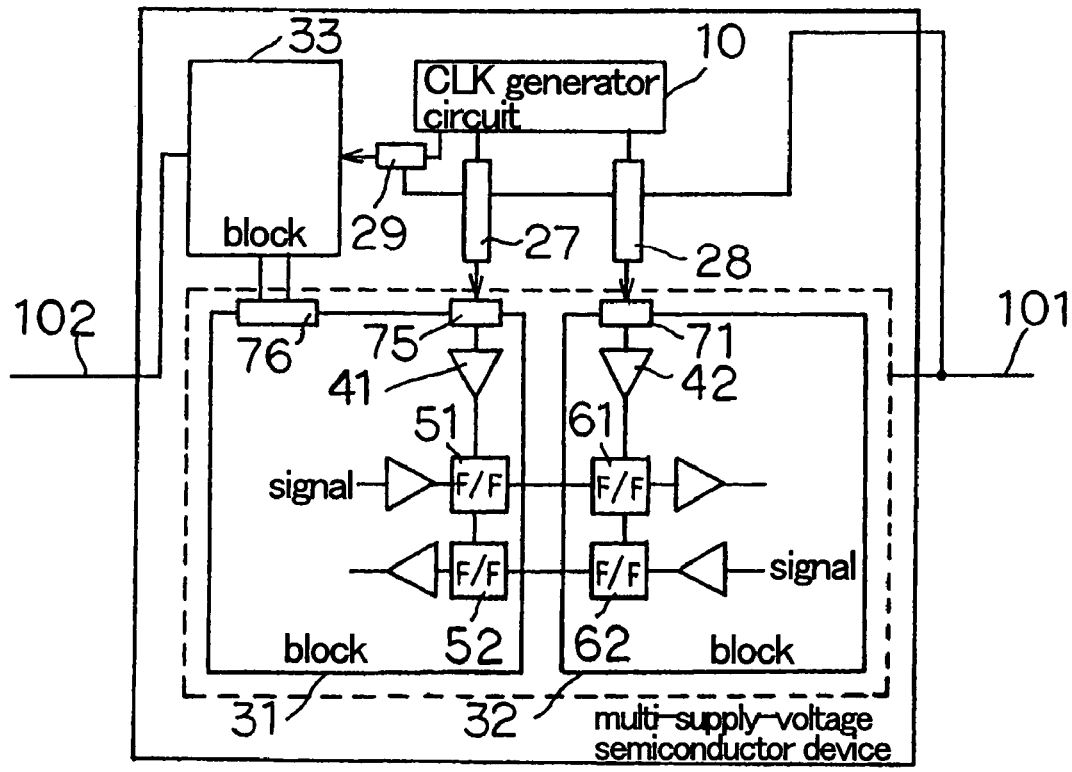
FIG. 49 is a block diagram showing a configuration of a multi-supply-voltage semiconductor device according to a thirteenth embodiment of the present invention.

A multiple-supply-voltage semiconductor device according to a thirteenth embodiment of the present invention will be described below. The multiple-supply-voltage semiconductor device according to the thirteenth embodiment includes two or more blocks supplied with variable power supply 101 and a block which is supplied with constant power supply 102 and is connected to the blocks by a signal. In the multiple-supply-voltage semiconductor device of the thirteenth embodiment, variable power supply 101 is connected to blocks 31, 32 and power supply 102 is connected to block 33 as shown in FIG. 49. Variable delay circuits 27, 28, and 29 are provided between clock generator circuit 10 and block 31, between circuit 10 and block 32, and between circuit 10 and block 33, respectively. Level shifters 71, 75, and 76 are provided at the interfaces between blocks 31, 32 supplied with variable power supply 101 and the other circuits, including block 33.

Fourteenth Embodiment

A multiple-supply-voltage semiconductor device according to a fourteenth embodiment of the present invention will be described below. While the first to thirteenth embodiments described above reduce clock skew between blocks of a multiple-supply-voltage semiconductor device, the fourteenth embodiment reduces clock skew between a multiple-supply-voltage semiconductor device and another semiconductor device.

Figure 50:
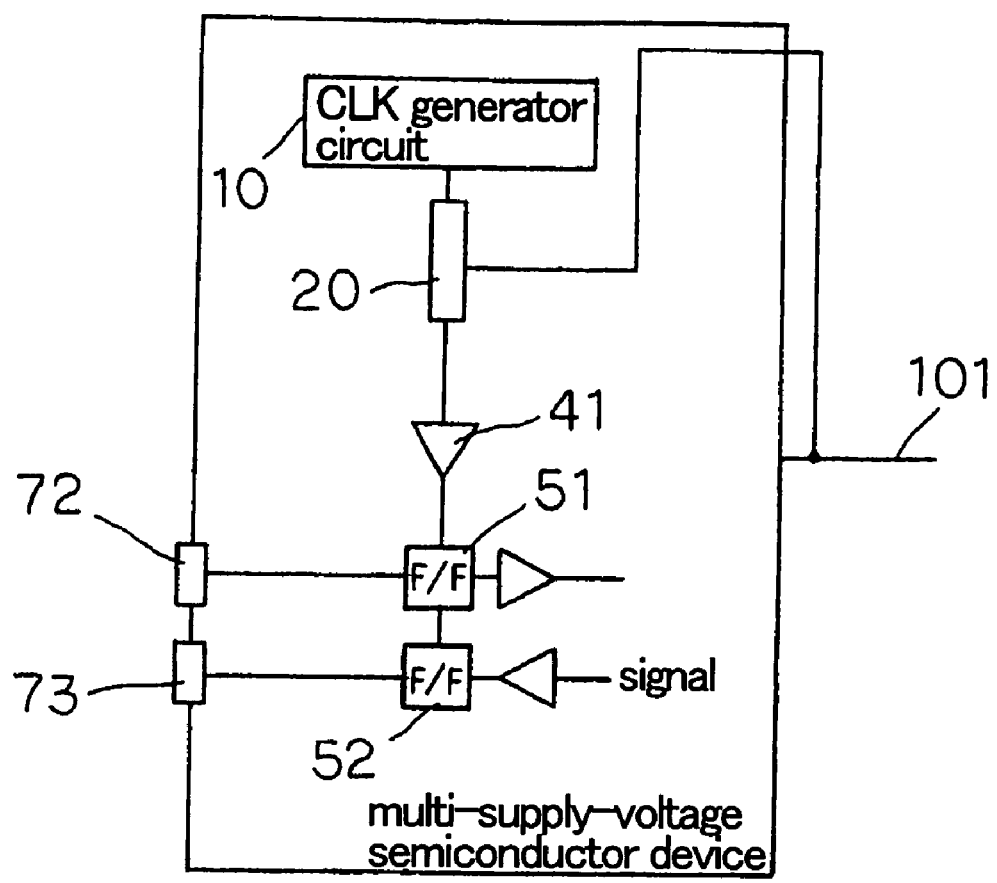
FIG. 50 is a block diagram showing a configuration of a multi-supply-voltage semiconductor device according to a fourteenth embodiment of the present invention.

The multiple-supply-voltage semiconductor device of the fourteenth embodiment includes clock generator circuit 10, variable delay circuit 20, clock circuit 41, and flip-flop circuits 51, 52 as shown in FIG. 50. Signals are inputted and outputted to and from another semiconductor device through level shifters 72, 73. The multiple-supply-voltage semiconductor device is supplied with variable power supply 101.

The multiple-supply-voltage semiconductor device configured as described above can reduce clock skew with respect to another semiconductor device by variable delay circuit 20 changing the amount of delay in accordance with the voltage value of variable power supply 101.

It will be apparent that the present invention is not limited to the embodiments described above but modifications can be made to the embodiments as appropriate within the scope of the technical ideas of the present invention. For example, while for simplicity the first to fourteenth embodiments have been described with respect to a case where the multiple-supply-voltage semiconductors device include two blocks and a single variable and/or non-variable power supply, the present invention is not so limited. The present invention can be equally applied to a case where a multiple-supply-voltage semiconductor device includes more than two blocks and more than one variable and/or non-variable power supply.

Furthermore, while power supplies to some circuits other than blocks 31, 32 have not specifically been mentioned in the above described embodiments, variable power supply 101 is provided to circuits such as clock generator circuit 10 if the multiple-supply-voltage semiconductor device is supplied with only variable power supply 101.

The invention claimed is:

1. A multi-supply-voltage semiconductor device comprising:
   at least one block receiving a variable supply voltage, said at least one block receiving a clock signal;
   a voltage level detector circuit which detects a voltage level of the variable supply voltage; and
   at least one variable delay circuit which provides a delay in the clock signal received by the at least one block, said delay changing in accordance with a change in the voltage level detected by the voltage level detector circuit;
   wherein said voltage level detector circuit comprises a differential amplifier into which the variable supply voltage and a reference voltage is input.

* * * * *